(12) United States Patent
Nishikawa et al.

(10) Patent No.: US 8,935,461 B2
(45) Date of Patent: Jan. 13, 2015

(54) MEMORY UNIT OUTPUTTING A REQUIRED TIME FOR A REWRITE AND METHOD FOR CONTROLLING CPU

(71) Applicant: Panasonic Corporation, Osaka (JP)

(72) Inventors: Kazuyo Nishikawa, Osaka (JP); Shuuhei Noichi, Shiga (JP); Makoto Arita, Kyoto (JP); Junichi Katou, Kyoto (JP); Asako Miyoshi, Kyoto (JP)

(73) Assignee: Panasonic Corporation, Osaka (JP)

( * ) Notice: Subject to any disclaimer, the term of this patent is extended or adjusted under 35 U.S.C. 154(b) by 231 days.

(21) Appl. No.: 13/740,948

(22) Filed: Jan. 14, 2013

(65) Prior Publication Data

US 2013/0132670 A1    May 23, 2013

Related U.S. Application Data

(63) Continuation of application No. PCT/JP2011/003445, filed on Jun. 16, 2011.

(30) Foreign Application Priority Data

Jul. 20, 2010    (JP) ................................ 2010-163079

(51) Int. Cl.
*G06F 11/14*    (2006.01)
*G06F 12/02*    (2006.01)
(Continued)

(52) U.S. Cl.
CPC ............ *G06F 12/00* (2013.01); *G06F 11/1412* (2013.01); *G06F 13/1689* (2013.01); *G06F 12/0246* (2013.01); *G06F 13/12* (2013.01); *G06F 2212/7205* (2013.01);
(Continued)

(58) Field of Classification Search
CPC ..... G06F 12/0246; G06F 12/12; G06F 13/12; G06F 13/1689; G06F 11/1412; G06F 11/14; G06F 2212/7205
USPC .................................................. 711/103, 167
See application file for complete search history.

(56) References Cited

U.S. PATENT DOCUMENTS 8,447,919 B1 * 5/2013 Agarwal et al. ............... 711/103
2003/0235080 A1  12/2003 Yaegashi et al.
(Continued)

FOREIGN PATENT DOCUMENTS

JP    03-230398 A    10/1991
JP    04-255997 A    9/1992
(Continued)

OTHER PUBLICATIONS

Numonyx® Axcell™ M29EW Data Sheet: 256-Mbit, 512-Mbit, 1-Gbit, 2-Gbit (x8/x16, uniform block) 3 V supply flash memory (Apr. 2011). The current URL is: http://media.digikey.com/pdf/Data%20Sheets/Numonyx,Intel/M29EW.pdf.
(Continued)

*Primary Examiner* — Hal Schnee
(74) *Attorney, Agent, or Firm* — McDermott Will & Emery LLP

(57) ABSTRACT

A memory includes a storage element which stores the number of times of application of a rewrite voltage pulse into a memory array, and a required-time output unit which outputs data representing a required time for a rewrite operation based on the number of times of application stored in the storage element.

30 Claims, 20 Drawing Sheets

(51) Int. Cl.
  *G06F 13/12* (2006.01)
  *G06F 12/00* (2006.01)
  *G06F 13/16* (2006.01)
  *G11C 11/56* (2006.01)
  *G11C 16/10* (2006.01)
  *G11C 16/34* (2006.01)
  *G11C 16/32* (2006.01)

(52) U.S. Cl.
  CPC ........... G11C 11/5628 (2013.01); G11C 16/10 (2013.01); *G11C 16/32* (2013.01); G11C 16/349 (2013.01); *G11C 2211/5621* (2013.01); *G11C 2211/5644* (2013.01)
  USPC .......................................... 711/103; 711/167

(56) References Cited

U.S. PATENT DOCUMENTS

| | | | |
|---|---|---|---|
| 2004/0057297 A1 | 3/2004 | Jang et al. | |
| 2007/0140017 A1 | 6/2007 | Kaneko et al. | |
| 2007/0198786 A1* | 8/2007 | Bychkov et al. | 711/154 |
| 2010/0287314 A1* | 11/2010 | Perry | 710/25 |
| 2011/0035536 A1* | 2/2011 | Shim et al. | 711/103 |
| 2011/0242901 A1* | 10/2011 | Marquart | 365/185.19 |
| 2014/0006691 A1* | 1/2014 | Haukness et al. | 711/103 |

FOREIGN PATENT DOCUMENTS

| | | |
|---|---|---|
| JP | 05-028035 A | 2/1993 |
| JP | 05-074179 A | 3/1993 |
| JP | 2003-099333 A | 4/2003 |

OTHER PUBLICATIONS

International Search report mailed Sep. 6, 2011 issued in corresponding International Application No. PCT/JP2011/003445.

* cited by examiner

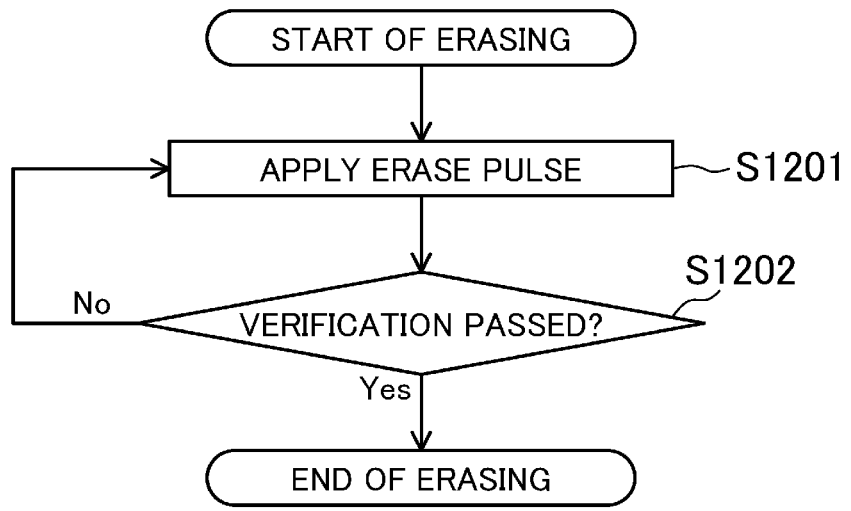
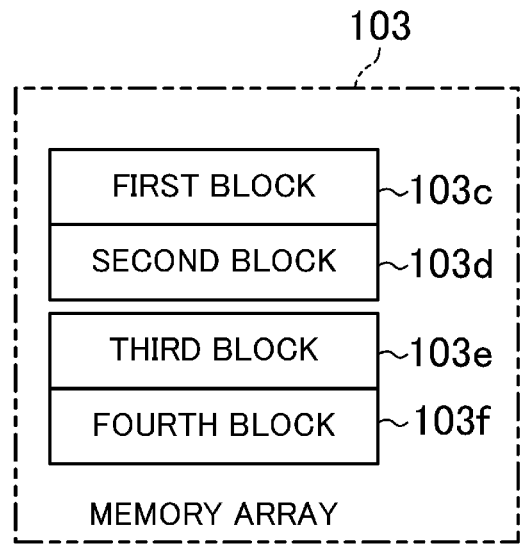

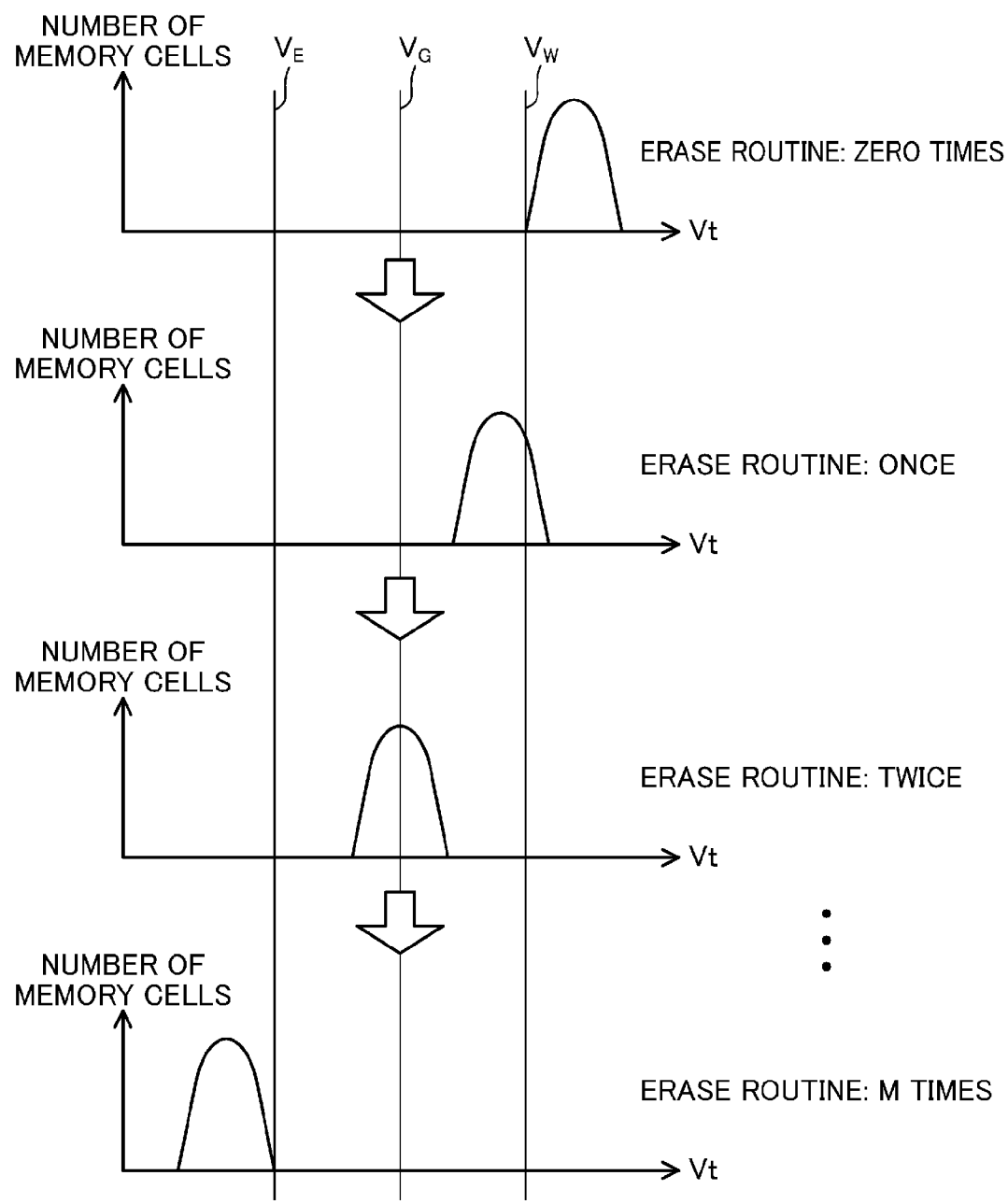

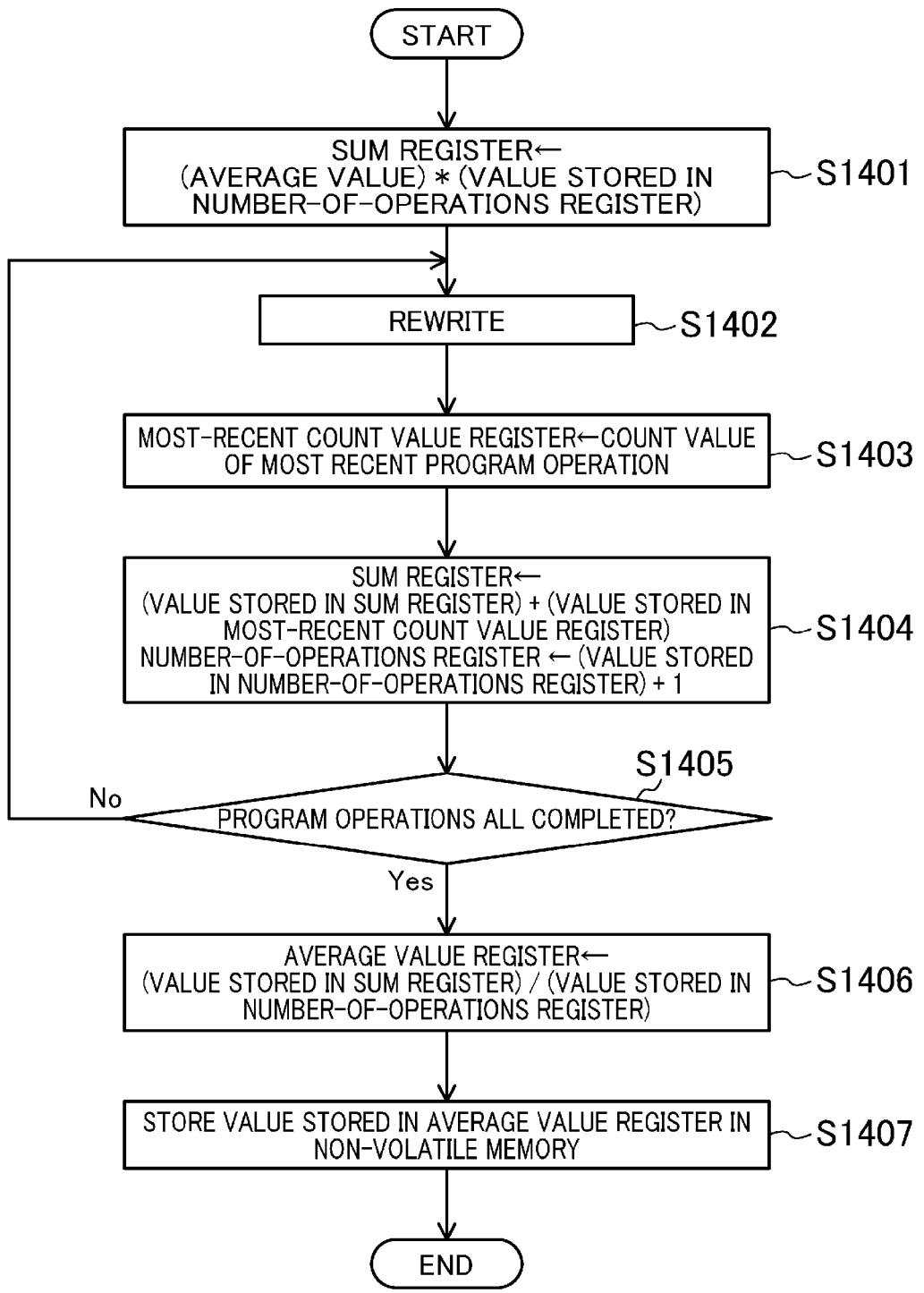

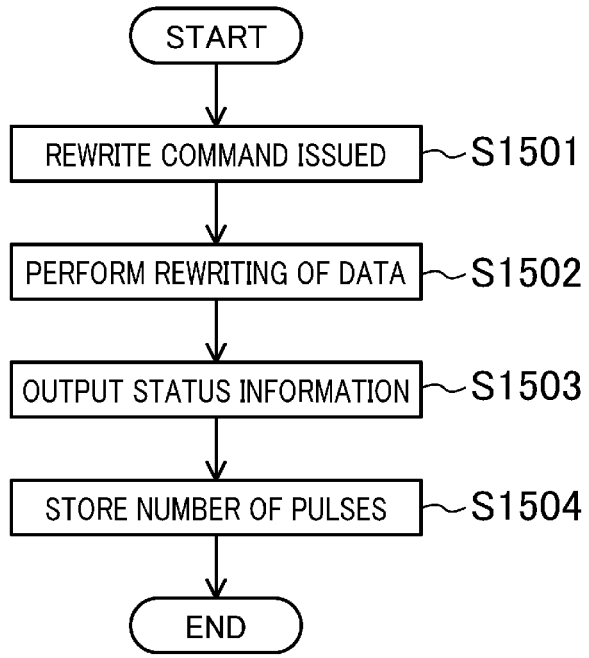
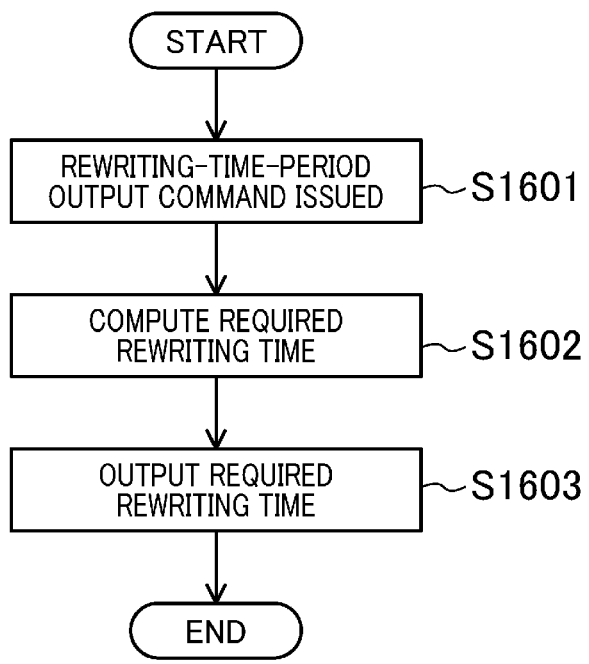

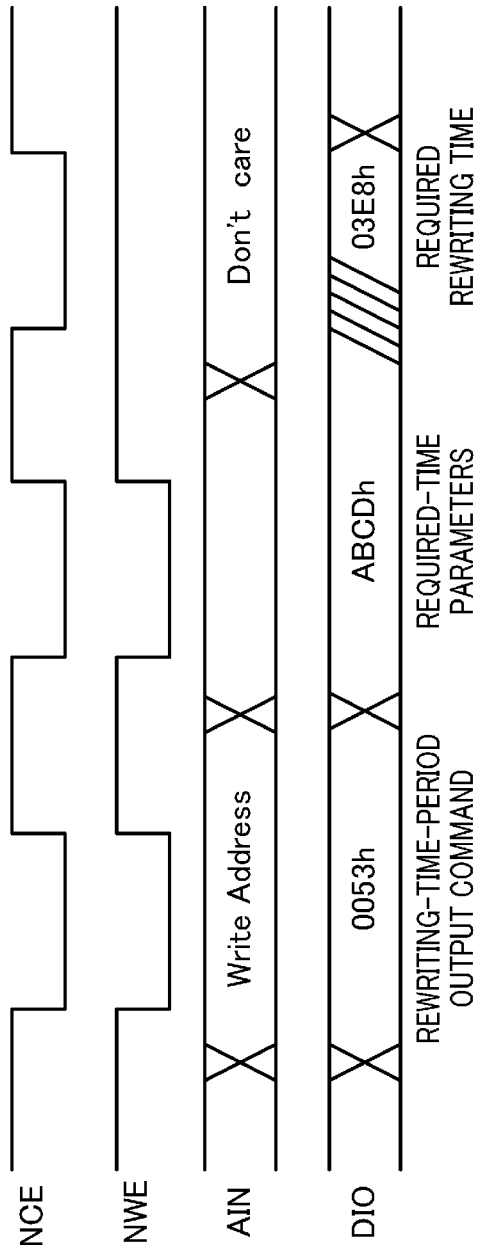

MEMORY UNIT OUTPUTTING A REQUIRED TIME FOR A REWRITE AND METHOD FOR CONTROLLING CPU

CROSS-REFERENCE TO RELATED APPLICATION

This is a continuation of PCT International Application PCT/JP2011/003445 filed on Jun. 16, 2011, which claims priority to Japanese Patent Application No. 2010-163079 filed on Jul. 20, 2010. The disclosures of these applications including the specifications, the drawings, and the claims are hereby incorporated by reference in their entirety.

BACKGROUND

The present disclosure relates to technologies for outputting a required time for a rewrite operation performed by a memory unit.

A document titled "Numonyx® Axcell™ M29EW Datasheet: 256-Mbit, 512-Mbit, 1-Gbit, 2-Gbit (x8/x16, uniform block) 3 V supply flash memory" (Non-Patent Document 1) is a datasheet for a Numonyx® brand flash memory. This datasheet contains typical values and maximum values of programming and erasing time periods for data expressed in predetermined units.

In addition, Japanese Patent Publication No. H3-230398 discloses a circuit for writing data into each address, and computing an average time required for writing from the first to last addresses of a programmable read-only memory (PROM).

Characteristics of various circuits, transistors, and memory cells which operate in a memory during a data program operation vary between chips due to various factors in the fabrication process. Moreover, the actual programming and erasing time periods also vary between chips. Accordingly, the typical values and the maximum values of programming and erasing time periods contained in the aforementioned datasheet may differ from typical values and maximum values of the actual programming and erasing time periods.

However, there is sometimes a need to obtain more accurately the programming and erasing time periods which are specific to the chip. For example, when a memory performs a data rewrite operation, there is a need to allow the host CPU to know accurate programming and erasing time periods for the memory in order to confirm at an appropriate time whether the data rewrite operation has completed or not.

In view of the foregoing, it is an object of the present disclosure to obtain more accurately the programming and erasing time periods which are specific to the chip.

SUMMARY

In order to solve the above problem, in one aspect of the present disclosure, a memory unit having a memory array having a plurality of memory cells which each store one of at least two values including a first value and a second value, where the memory unit performs a rewrite operation by repeating application of a rewrite voltage pulse and verification, includes a storage element configured to store a number of times of application of the rewrite voltage pulse into the memory array, and a required-time output unit configured to output data representing a required time for a rewrite operation based on the number of times of application stored in the storage element.

According to this aspect, the memory unit outputs a required time for a rewrite operation based on the number of times of application of a rewrite voltage pulse.

In another aspect of the present disclosure, a memory unit having a memory array having a plurality of memory cells which each store one of at least two values including a first value and a second value, where the memory unit performs a rewrite operation by repeating application of a rewrite voltage pulse and verification, includes a table storage unit configured to store a table containing both a plurality of value ranges of a number of rewrite operations since manufacturing, and numbers of pulses respectively corresponding to the plurality of value ranges, and a required-time output unit configured to determine a number of pulses associated, in the table, with a value range including a value of a number of operations indicating an ordinal number, since manufacturing, of the rewrite operation for which a required time is to be computed, to compute the required time for the rewrite operation based on the number of pulses determined, and to output data representing the required time.

According to this aspect, since the required time is computed based on the number of pulses associated with the value of the number of operations in the table, storing a table specific to the memory unit in the table storage unit enables a more accurate required time to be obtained based on characteristics of the memory unit and on the number of rewrite operations.

In still another aspect of the present disclosure, a memory unit having a memory array, where the memory unit performs a rewrite operation by repeating application of a rewrite voltage pulse and verification, includes a required-time output unit configured to output data specific to the chip as data representing a required time for the rewrite operation.

According to this aspect, the required time for a rewrite operation specific to the chip can be obtained.

According to the present disclosure, the required time for a rewrite operation specific to the chip can be accurately obtained.

BRIEF DESCRIPTION OF THE DRAWINGS

FIG. 7 is a flowchart illustrating an erase operation on data in the memory according to the first embodiment of the present disclosure.

FIG. 8 is a block diagram illustrating a configuration of the memory array according to the first embodiment of the present disclosure.

FIG. 9 is a graph illustrating an example of transition of the distribution of the threshold voltage Vt during an erase operation on a memory cell block according to the first embodiment of the present disclosure.

FIG. 12 is flowchart illustrating an operation of the average value storage unit according to the first embodiment of the present disclosure.

FIG. 13 is a flowchart illustrating the rewrite operation of the memory according to the first embodiment of the present disclosure.

FIG. 14 is a flowchart illustrating a process of outputting the rewriting time period of the memory according to the first embodiment of the present disclosure.

FIG. 15 is a timing chart illustrating an operation of transmitting and receiving signals performed between the host CPU and the memory when a rewriting-time-period output command is issued by the host CPU according to the first embodiment of the present disclosure.

DETAILED DESCRIPTION

Example embodiments of the present disclosure are described below with reference to the attached drawings.

First Embodiment

<Overall Configuration and Operation Overview of System>

Figure 1:
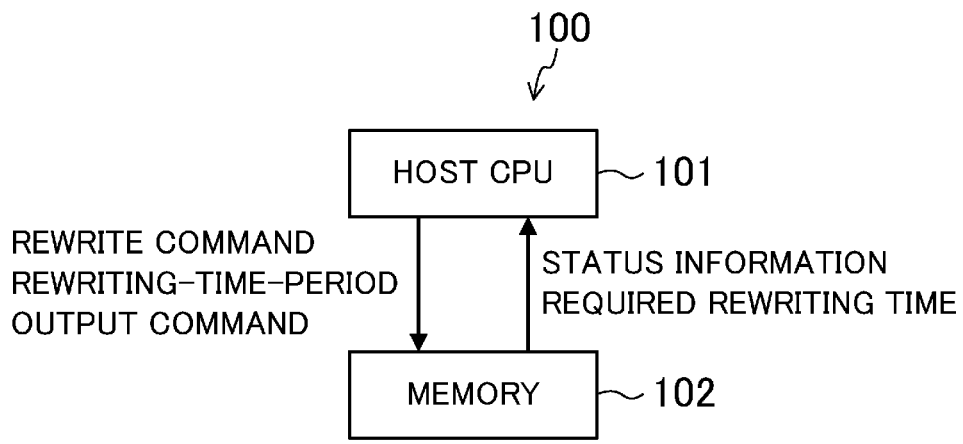
FIG. 1 is a block diagram illustrating a configuration of a memory embedded system according to the first embodiment of the present disclosure.

FIG. 1 illustrates a memory embedded system 100 according to the first embodiment of the present disclosure.

The memory embedded system 100 includes a host CPU 101 and a memory 102. The memory 102 is formed of a semiconductor integrated circuit (chip).

The host CPU 101 issues a rewrite command and a rewriting-time-period output command.

When detecting a rewrite command issued by the host CPU 101, the memory 102 performs rewriting (a rewrite operation) of data. When detecting a rewriting-time-period output command issued by the host CPU 101, the memory 102 outputs a required rewriting time computed in the memory 102. A method for computing a required rewriting time will be described later in this specification.

The memory 102 also outputs status information indicating that a rewrite operation is being performed (busy state), that the rewrite operation has completed (ready state), that the rewrite operation has failed (error state), etc. Based on the status information output by the memory 102, the host CPU 101 determines which process or processes to perform of a plurality of processes other than rewriting, such as waiting.

Figure 2:
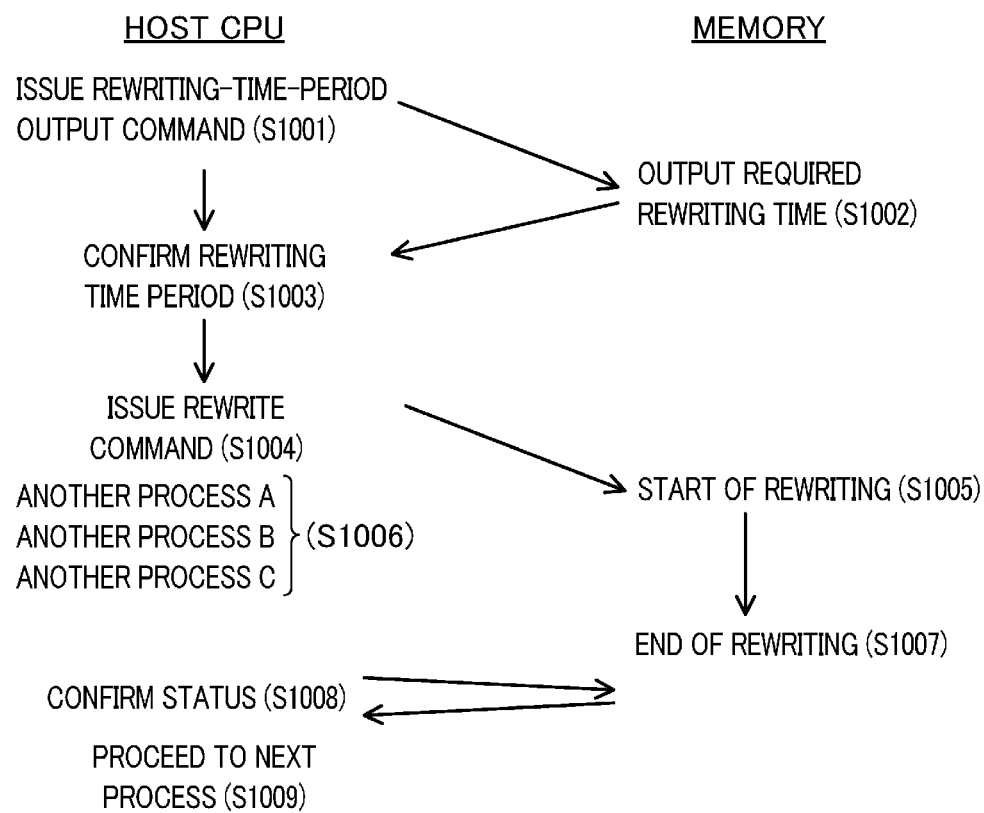
FIG. 2 is a flow diagram illustrating the operations by the host CPU and by the memory according to the first embodiment of the present disclosure.

Here, the operations of the host CPU 101 and of the memory 102 will be described referring to the flow diagram of FIG. 2.

First, after the host CPU 101 issues a rewriting-time-period output command at step S1001, the memory 102 detects the rewriting-time-period output command, and at step S1002, outputs a required rewriting time, which is a time period required for rewriting data. Next, the host CPU 101 receives the required rewriting time output by the memory 102, sets a rewrite completion time based on the required rewriting time at step S1003, and then issues a rewrite command at step S1004. The memory 102 detects the rewrite command, and at step S1005, starts rewriting of data. During the time period in which the memory 102 performs the rewriting, the host CPU 101 performs other process or processes based on the required rewriting time at step S1006. When the rewrite completion time which has been set at step S1003 is reached, the memory 102 completes the rewriting at step S1007. Then, at step S1008, the host CPU 101 reads status information output by the memory 102 to confirm the completion of the rewriting, and at step S1009, proceeds to the next process.

<Configuration and Operation of Memory 102>

Figure 3:
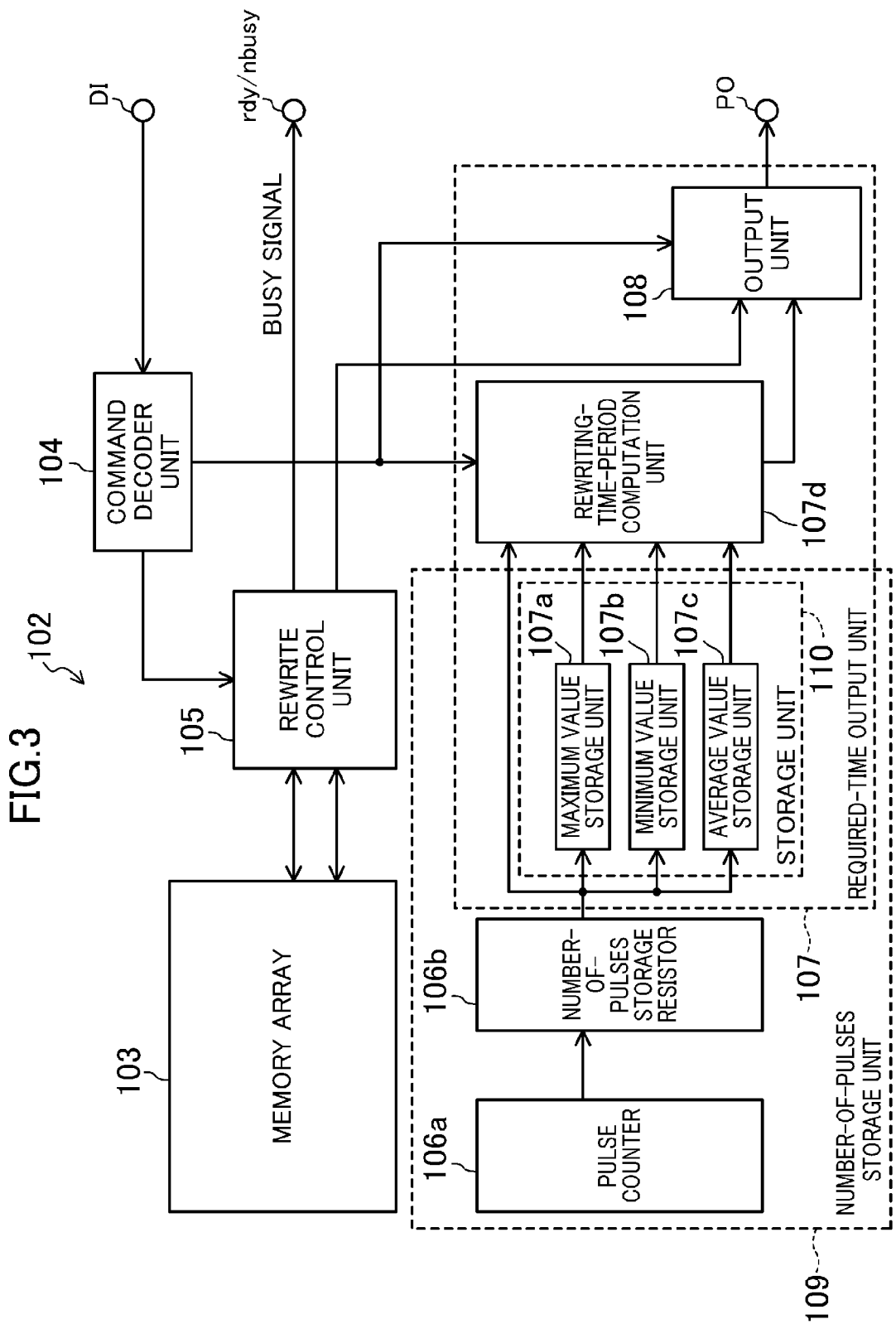
FIG. 3 is a block diagram illustrating a configuration of the memory according to the first embodiment of the present disclosure.

FIG. 3 illustrates the memory 102.

The memory 102 is a non-volatile flash memory (flash electrically erasable and programmable read only memory (flash EEPROM)). The memory 102 includes a data input terminal DI, a data output terminal DO, a status information output terminal rdy/nbusy, a memory array 103, a command decoder unit 104, a rewrite control unit 105, a pulse counter 106a, a number-of-pulses storage resistor (storage element) 106b, and a required-time output unit 107.

The data input terminal DI receives a rewrite command and a rewriting-time-period output command issued by the host CPU 101.

Figure 4:
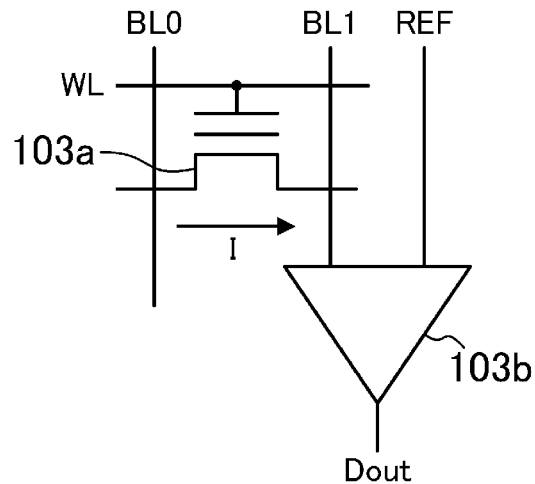
FIG. 4 is a circuit diagram illustrating each of the memory cells according to the first embodiment of the present disclosure, and a sense amplifier for reading data in this memory cell.

The memory array 103 includes a plurality of memory cells arranged in a matrix format. Referring to FIG. 4, a description is provided below in terms of a read operation on data in a memory cell 103a, which is one of the plurality of memory cells and is coupled to a bit line BL0 and to a bit line BL1.

The memory 102 includes a sense amplifier 103b for reading data in the memory cell 103a. The sense amplifier 103b compares the voltage of the bit line BL1 dependent on the presence or absence of memory cell current I with a reference voltage of a reference voltage line REF, and outputs a logical 1 or 0 as a data output Dout depending on the comparison result.

Figure 5:
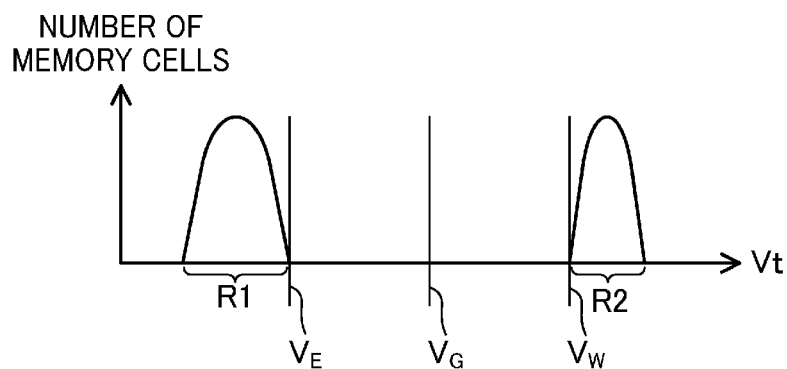
FIG. 5 is a graph illustrating a distribution of the threshold voltage Vt of the memory cell according to the first embodiment of the present disclosure.

That is, it is determined whether the data is a logical 1 or 0 based on a threshold voltage Vt of the memory cell 103a. More specifically, as shown in FIG. 5, a state where the threshold voltage Vt is at a high (H) level within a range R1 is determined to be an erase state (data is a logical 1 (first value)), and a state where the threshold voltage Vt is at a low level within a range R2 is determined to be a program state (data is a logical 0 (second value)). The middle level between the range R1 and the range R2 is set to a gate voltage $V_G$ during a read operation. If the memory cell 103a is in an erase state when reading data, the threshold voltage Vt is lower than the gate voltage $V_G$, and therefore a memory cell current I flows through the memory cell 103a. Conversely, if the memory cell 103a is in a program state when reading data, the threshold voltage Vt is higher than the gate voltage $V_G$, and therefore no memory cell current I flows through the memory cell 103a.

Next, a rewrite operation on data in a memory cell will be described. A rewrite operation is an operation to increase or decrease the threshold voltage of a memory cell, and is either a program operation (first rewrite operation) or an erase operation (second rewrite operation).

Figure 6:
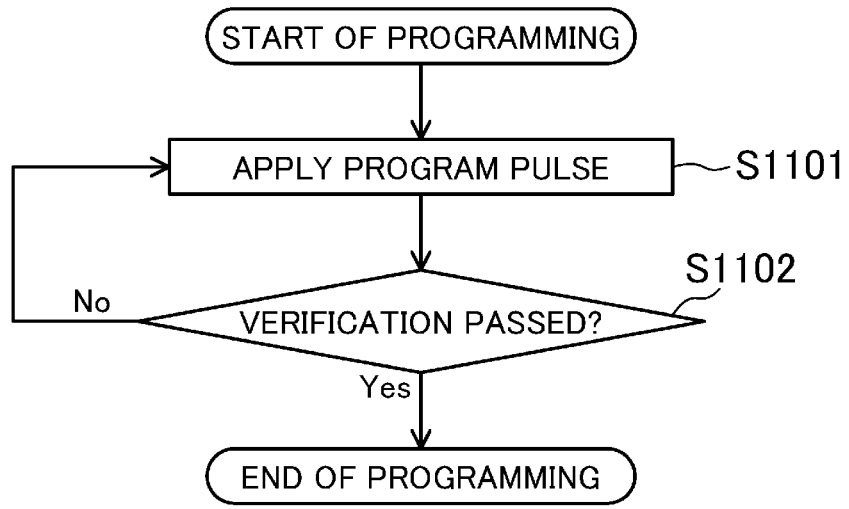
FIG. 6 is a flowchart illustrating a program operation on data in the memory according to the first embodiment of the present disclosure.

FIG. 6 is a flowchart illustrating a program operation on data in a memory cell.

First, at step S1101, the rewrite control unit 105 applies a high positive voltage to the gate and the drain of the memory cell as a rewrite voltage pulse, thereby increases the threshold voltage Vt. Next, at step S1102, the rewrite control unit 105 sets the gate voltage of the memory cell to a verify level $V_W$ which is higher than the gate voltage $V_G$ in a read operation (see FIG. 5), and then, in a similar manner to the read operation described above, determines whether the threshold voltage Vt of the memory cell has or has not reached the verify level $V_W$ using the sense amplifier 103b. If the threshold voltage Vt of the memory cell has reached the verify level $V_W$, then the program operation is completed. Conversely, if the threshold voltage Vt of the memory cell has not yet reached the verify level $V_W$, then the process returns to step S1101.

Next, an erase operation on data in a memory cell will be described.

FIG. 7 is a flowchart illustrating an erase operation on data in a memory cell.

First, at step S1201, the rewrite control unit 105 applies a negative voltage having a high absolute value to the gate of the memory cell, and a high positive voltage to the drain thereof as the rewrite voltage pulse, thereby couples electrons and holes captured by a program operation, and thus decreases the threshold voltage Vt. Next, at step S1202, the rewrite control unit 105 sets the gate voltage of the memory cell to a verify level $V_E$ which is lower than the gate voltage $V_G$ in a read operation (see FIG. 5), and then, in a similar manner to the read operation described above, determines whether the threshold voltage Vt of the memory cell has or has not reached the verify level $V_E$ using the sense amplifier 103b. If the threshold voltage Vt of the memory cell has reached the verify level $V_E$, then the erase operation is completed. Conversely, if the threshold voltage Vt of the memory cell has not yet reached the verify level $V_E$, then the process returns to step S1201.

As shown in FIG. 8, the memory array 103 includes a first through fourth memory cell blocks (groups of memory cells) 103c-103f. The first through fourth memory cell blocks 103c-103f each have an individual matrix format. A single erase operation is performed on one entire memory cell block of the first through fourth memory cell blocks 103c-103f at one time. Thus, the erase routine from step S1201 to step S1202 is repeated until the determination at step S1202 results in YES for all the memory cells in the memory cell block to be erased.

FIG. 9 illustrates an example of transition of the distribution of the threshold voltage Vt during an erase operation on a memory cell block.

An erase operation completes when the threshold voltage Vt falls to or below the verify level $V_E$ for all the memory cells in the memory cell block.

The command decoder unit 104 receives and decodes a rewrite command and a rewriting-time-period output command which are input to the data input terminal DI, and outputs decoding results.

The rewrite control unit 105 detects the decoding result output by the command decoder unit 104, and performs a rewrite operation on data stored in the memory array 103 if the command decoder unit 104 has received a rewrite command. The rewrite control unit 105 continuously monitors the state during the rewrite operation, and outputs status information indicating the current state.

Figure 10:
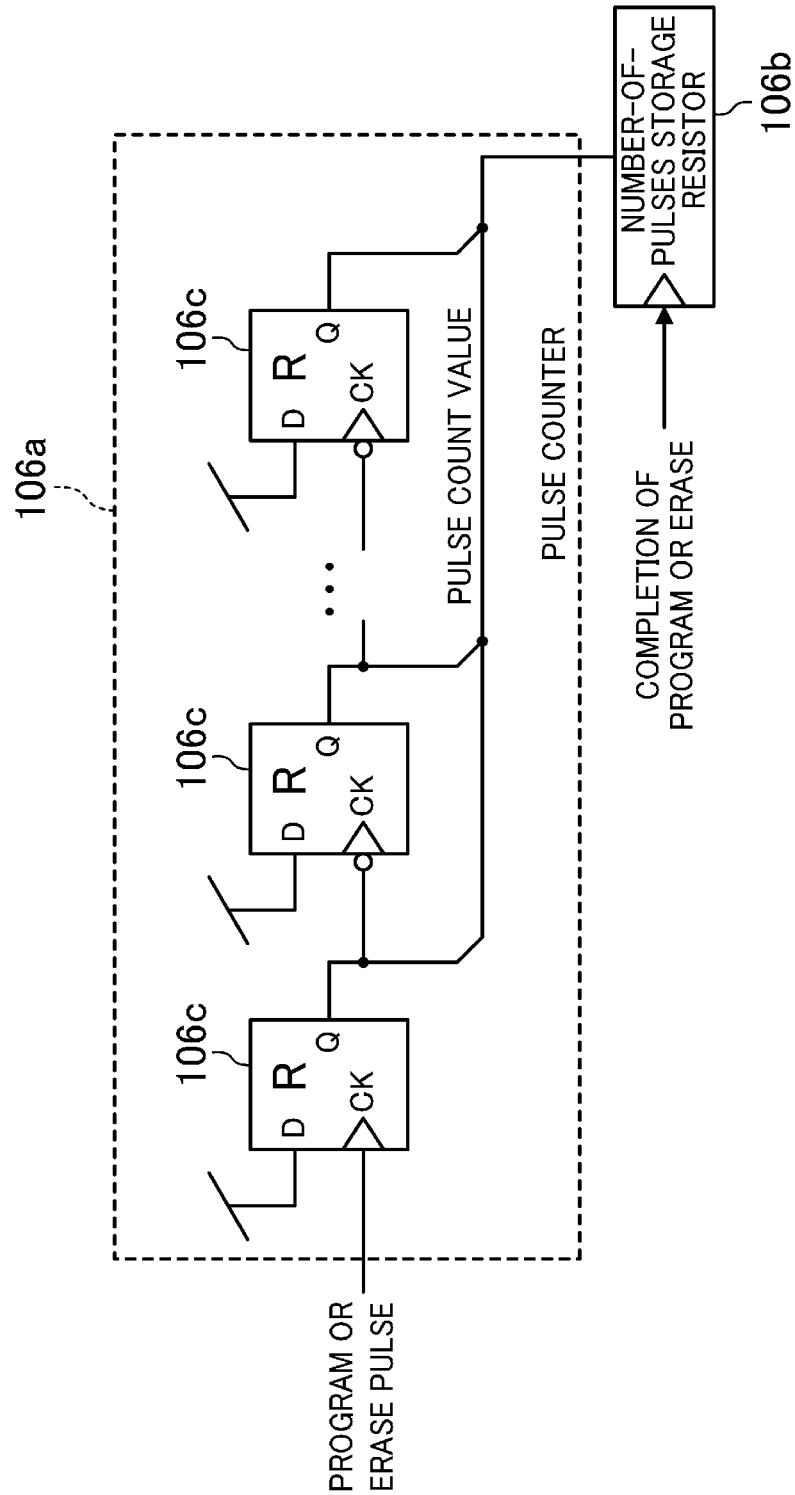
FIG. 10 is a block diagram illustrating a configuration of the pulse counter according to the first embodiment of the present disclosure.

The pulse counter 106a counts both the number of times of application of a program pulse during programming and the number of times of application of an erase pulse during erasing. More specifically, as shown in FIG. 10, the pulse counter 106a includes a plurality of D flip-flops 106c each having an input D fixed to a logical 1. The pulse counter 106a receives a program pulse or an erase pulse.

The number-of-pulses storage resistor 106b stores a pulse count value of the pulse counter 106a upon completion of programming or erasing. Note that the number-of-pulses storage resistor 106b includes a non-volatile memory, so that the pulse count value can be retained even after the electrical power is removed.

The pulse count value of the pulse counter 106a is initialized to "0" at the beginning of a rewrite operation, and therefore the value stored in the number-of-pulses storage resistor 106b is the number of pulses that has been required during a time period from the beginning to the end of the rewrite operation. In other words, when programming, the value stored is the number of times of application of a program pulse until the decision at step S1102 of FIG. 6 results in YES, that is, the number of times to perform step S1101. On the other hand, when erasing, the value stored is the number of times of application of an erase pulse until the decision at step S1202 of FIG. 7 results in YES, that is, the number of times to perform step S1201.

The number-of-pulses storage resistor 106b stores, independently of each other, the numbers of pulses required for programming and required for erasing.

The required-time output unit 107 includes a maximum value storage unit 107a, a minimum value storage unit 107b, an average value storage unit 107c, a rewriting-time-period computation unit 107d, and an output unit 108.

The maximum value storage unit 107a stores the maximum value of the stored values stored in the number-of-pulses storage resistor 106b for a predetermined number of program operations. The predetermined number may be one, or may be more than one. More specifically, the maximum value storage unit 107a includes a most-recent count value register, a maximum value register, and a non-volatile memory. The most-recent count value register stores the count value obtained for the most-recent program operation by a count operation of the pulse counter 106a.

Figure 11:
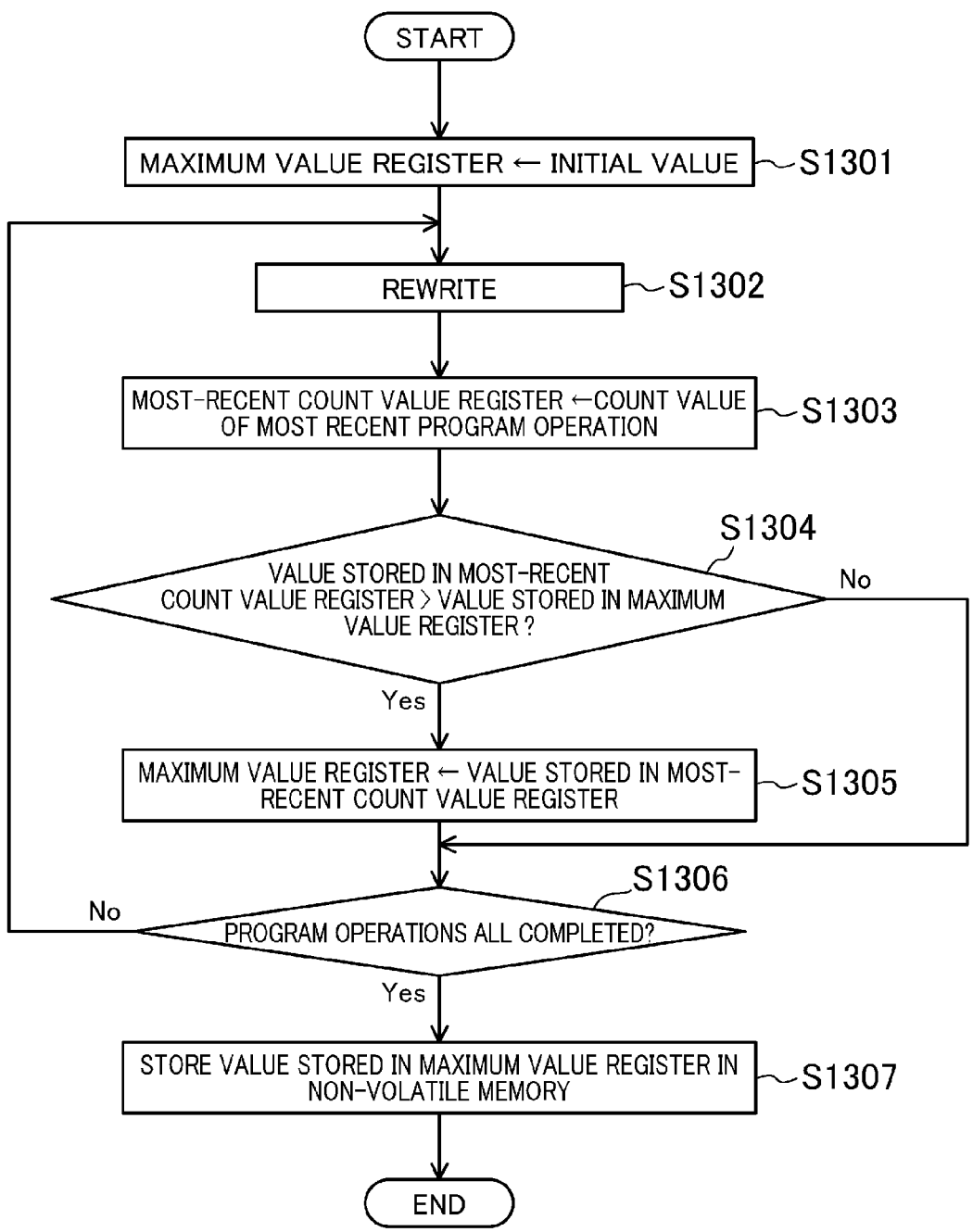
FIG. 11 is a flowchart illustrating an operation of the maximum value storage unit according to the first embodiment of the present disclosure.

Here, an operation of the maximum value storage unit 107a will be described referring to the flowchart of FIG. 11.

First, before starting the predetermined number of program operations, the maximum value storage unit 107a stores an initial value "0" into the maximum value register at step S1301. After the programming is started, a program operation is performed at step S1302, and thereafter, at step S1303, the count value obtained for the program operation performed at the most recent step S1302 by a count operation of the pulse counter 106a is stored in the most-recent count value register. Next, at step S1304, the maximum value storage unit 107a compares the value stored in the most-recent count value register with the value stored in the maximum value register. If the value stored in the most-recent count value register is higher, then the process proceeds to step S1305, while if the value stored in the maximum value register is higher, then the process proceeds to step S1306. At step S1305, the maximum value storage unit 107a stores the value stored in the most-recent count value register into the maximum value register, and the process proceeds to step S1306. At step S1306, the maximum value storage unit 107a determines whether the predetermined number of program operations has completed or not. If completed, the process proceeds to step S1307, while if not completed, the process returns to step S1302. At step S1307, the maximum value storage unit 107a stores the value stored in the maximum value register into the non-volatile memory, and thus the process completes.

Note that the process may be such that information indicating a null state is stored into the maximum value register at step S1301, that it is determined whether the information contained in the maximum value register indicates a null state or not, and that if it is determined that the information contained in the maximum value register indicates a null state, then the process proceeds to step S1305.

The minimum value storage unit 107b stores the minimum value of the stored values stored in the number-of-pulses storage resistor 106b for a predetermined number of program operations. More specifically, the minimum value storage unit 107b includes a most-recent count value register, a minimum value register, and a non-volatile memory. The minimum value storage unit 107b compares the value stored in the minimum value register with the value stored in the most-recent count value register for each performance of a program operation. If the value stored in the most-recent count value register is lower, then this stored value is stored into the minimum value register. The initial value of the minimum value register is set to a higher value than the number of pulses typically required for a program operation.

The average value storage unit 107c stores the average value of the stored values stored in the number-of-pulses storage resistor 106b for a predetermined number of program operations. The average value storage unit 107c includes a most-recent count value register, a sum register which stores the summed value of the values stored in the number-of-pulses storage resistor 106b, and a number-of-operations register which stores a value indicating the number of program operations performed since the beginning of summation.

Here, an operation of the average value storage unit 107c will be described referring to the flowchart of FIG. 12.

First, at step S1401, the average value storage unit 107c stores a product of the average value already stored therein and the value stored in the number-of-operations register into the sum register. Next, after a program operation is performed at step S1402, the count value obtained for the program operation performed at the most recent step S1402 by a count operation of the pulse counter 106a is stored in the most-recent count value register at step S1403. Next, at step S1404, the average value storage unit 107c stores the sum of the value stored in the sum register and the value stored in the most-recent count value register into the sum register, and adds "1" to the value stored in the number-of-operations register. At step S1405, the average value storage unit 107c determines whether the predetermined number of program operations has completed or not. If completed, the process proceeds to step S1406, while if not completed, the process returns to step S1402. At step S1406, the average value storage unit 107c stores, into an average value register, the quotient obtained by dividing the value stored in the sum register by the value stored in the number-of-operations register. At step S1407, the average value storage unit 107c stores the value stored in the average value register into the non-volatile memory, and thus the process completes.

The maximum value storage unit 107a also stores the maximum value of the numbers of pulses which have been required for respective erase operations (numbers of times of application of an erase pulse) in addition to the maximum value of the numbers of pulses which have been required for respective program operations. Similarly, the minimum value storage unit 107b also stores the minimum value of the numbers of times of application of an erase pulse, and the average value storage unit 107c also stores the average value of the numbers of times of application of an erase pulse. The maximum value storage unit 107a, the minimum value storage unit 107b, and the average value storage unit 107c form a storage unit 110.

The rewriting-time-period computation unit 107d computes the required time for a rewrite operation on data (required rewriting time) based on the numbers of pulses stored in the storage unit 110. This process of computing the required time is performed when the required-time output unit 107 receives a decoding result output from the command decoder unit 104, and the command decoder unit 104 has received a rewriting-time-period output command. A method for computing the required time will be described in further detail later in this specification.

The output unit 108 receives a decoding result output from the command decoder unit 104. Then, if the command decoder unit 104 has received a rewrite command, the output unit 108 outputs the status information output by the rewrite control unit 105; otherwise, if the command decoder unit 104 has received a rewriting-time-period output command, the output unit 108 outputs the required rewriting time computed by the rewriting-time-period computation unit 107d.

The data output terminal DO outputs the output of the output unit 108 to outside the memory 102.

The status information output terminal rdy/nbusy outputs a part of status information to outside the memory 102.

The pulse counter 106a, the number-of-pulses storage resistor 106b, the maximum value storage unit 107a, the minimum value storage unit 107b, and the average value storage unit 107c form a number-of-pulses storage unit 109.

FIG. 13 is a flowchart illustrating the rewrite operation of the memory 102.

When the memory 102 receives a rewrite command issued by the host CPU 101 at step S1501, the memory 102 performs rewriting of data at step S1502. Thereafter, at step S1503, the memory 102 outputs status information indicating that the rewriting has completed, and at step S1504, stores the pulse count value of the pulse counter 106a into the number-of-pulses storage resistor 106b.

FIG. 14 is a flowchart illustrating a process of outputting the rewriting time period of the memory 102.

When the memory 102 receives a rewriting-time-period output command issued by the host CPU 101 at step S1601, the memory 102 instructs the rewriting-time-period computation unit 107d to compute a required rewriting time at step S1602, and outputs the required rewriting time computed by the rewriting-time-period computation unit 107d from the data output terminal DO at step S1603.

The processes of FIG. 13 and of FIG. 14 are performed as independent process flows. That is, the rewriting-time-period computation unit 107d can read the values in the storage unit 110 and compute a required rewriting time without any rewrite operation on data being performed.

Operations of storing values into the maximum value storage unit 107a, into the minimum value storage unit 107b, and into the average value storage unit 107c are performed during the test phase. Thus, the memory 102 already contains values in the maximum value storage unit 107a, in the minimum value storage unit 107b, and in the average value storage unit 107c even when no rewrite operations are yet performed after shipment, thereby allowing a required rewriting time to be output before performing a first rewrite operation.

Depending on application, the values stored in the maximum value storage unit 107a, in the minimum value storage unit 107b, and in the average value storage unit 107c may be updated as appropriate. For example, the maximum value storage unit 107a may perform steps S1303-S1305 of FIG. 11 for each performance of a rewrite operation. Thus, although the memory 102 has a characteristic such that the required time per operation increases with the number of repetitions of the rewrite operation, the number of pulses reflecting more recent conditions can be obtained. Similarly, the minimum value and the average value can also be increased in accuracy by updating. In addition, the number of pulses required may be updated based on characteristics of the memory devices and/or user demand.

<Operation of Host CPU 101 when Receiving Required Rewriting Time>

Next, an operation of the host CPU 101 when receiving a required rewriting time will be described.

FIG. 15 illustrates an operation of transmitting and receiving signals performed between the host CPU 101 and the memory 102 when a rewriting-time-period output command is issued by the host CPU 101.

First, in the first cycle, the host CPU 101 outputs a value 53h representing the rewriting-time-period output command to the data bus DIO, and outputs low (L) level as an access signal NCE and a write enable signal NWE to the memory 102. Next, in the second cycle, the host CPU 101 outputs required-time parameters, which will be described later in this specification. In the third cycle, the host CPU 101 drives the access signal NCE low while maintaining the write enable signal NWE at a high (H) level; the memory 102 outputs the required rewriting time 03E8h computed by the rewriting-time-period computation unit 107d to the data bus DIO. The host CPU 101 receives the required rewriting time 03E8h, and sets the rewrite completion time.

Table 1 below lists the required-time parameters output by the host CPU 101.

TABLE 1

| DI[15:12] | DI[11:10] | DI[9:8] | DI[7:4] | DI[3:2] | DI[1:0] |
| --- | --- | --- | --- | --- | --- |
| Number-of-Rewrites Information | Rewrite Temperature Information | Rewrite Unit Information | Rewrite Address Information | Output Format Information | Output Selection Information |

The required-time parameters include the following information:
Number-of-rewrites information: indicates the ordinal number of the rewrite operation the time required for which is to be received
Rewrite temperature information: indicates an approximate temperature corresponding to the rewrite operation the time required for which is to be received
Rewrite unit information: indicates whether to receive the required time for a single rewrite operation on a memory cell corresponding to a single address, or to receive the total required time for rewrite operations on the entire memory cell block (address area)
Rewrite address information: indicates the memory cell block (address area) corresponding to a rewrite operation the time required for which is to be received
Output format information: indicates which one is to be received, of the required time in units of seconds, the number of system clocks corresponding to the required time, and the number of pulses corresponding to the required time.
Output selection information: indicates which one is to be received, of the required programming time, the required erasing time, and the total required time of an erase and a program operations The host CPU 101 may output, instead of the rewrite unit information described above, type-of-time information, indicating which required time is to be received of the followings: the required time computed based on the maximum value stored in the maximum value storage unit 107a, the required time computed based on the minimum value stored in the minimum value storage unit 107b, or the required time computed based on the average value stored in the average value storage unit 107c. For example, a relationship may be defined such that type-of-time information of a value "00" corresponds to the minimum value, type-of-time information of a value "01" corresponds to the maximum value, and type-of-time information of a value "10" corresponds to the average value.

<Method for Computing Required Time by Rewriting-Time-Period Computation Unit 107d>

Next, a method for computing a required time performed by the rewriting-time-period computation unit 107d of the memory 102 will be described.

If the output selection information specifies "required programming time," then the rewriting-time-period computation unit 107d computes the required programming time based on the maximum, minimum, or average value of the number of times of application of a program pulse stored in the storage unit 110. If the output selection information specifies "required erasing time," then the rewriting-time-period computation unit 107d computes the required erasing time based on the maximum, minimum, or average value of the number of times of application of an erase pulse stored in the storage unit 110. Otherwise, if the output selection information specifies "total required time," then the rewriting-time-period computation unit 107d computes the total required time based on the maximum, minimum, or average value of the number of times of application of a program pulse and the maximum, minimum, or average value of the number of times of application of an erase pulse, both stored in the storage unit 110.

Figure 16:
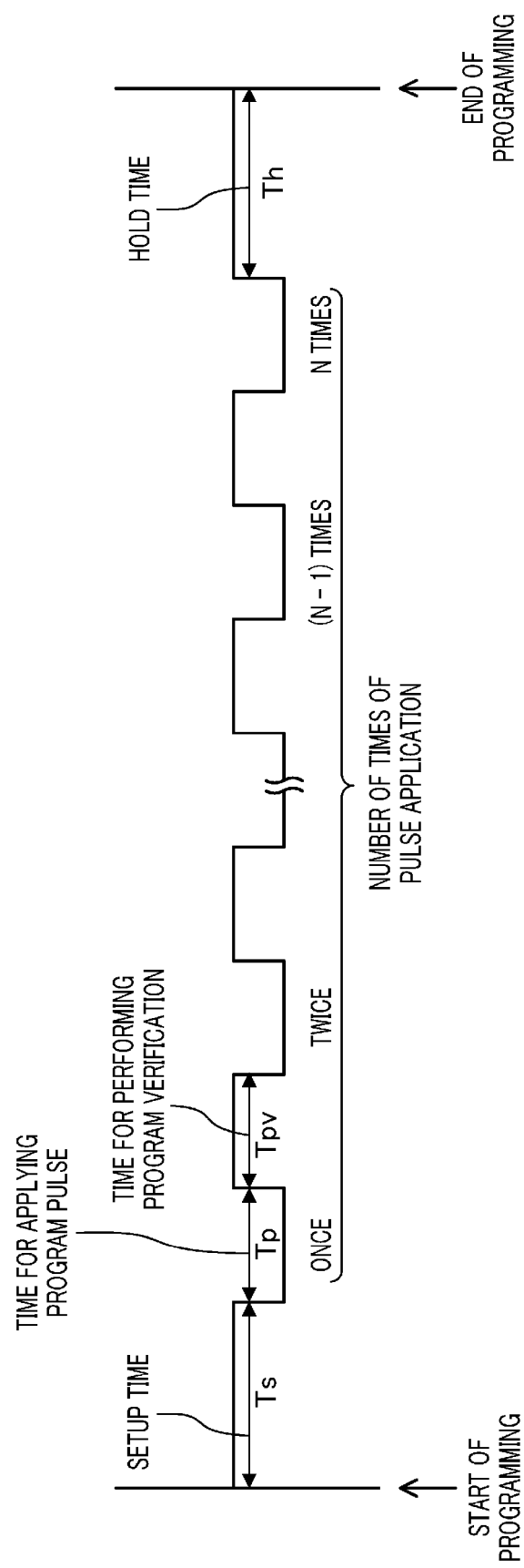
FIG. 16 is a waveform diagram illustrating a waveform of a voltage applied to target memory cells to be programmed during a program operation according to the first embodiment of the present disclosure.

FIG. 16 illustrates a waveform of a voltage applied to target memory cells to be programmed during a program operation. The notations used herein are:

Ts: setup time of peripheral circuits of the memory, necessary for starting the program operation Tp: time period during which a program pulse is applied to that memory cell Tpv: time period during which a program verify operation is performed Th: hold time of peripheral circuits of the memory, necessary for completing the program operation N: number of times of application of a program pulse The value of N is set as follows. If the type-of-time information output by the host CPU 101 indicates "minimum value," then the value of N is the minimum value stored in the minimum value storage unit 107b. If the type-of-time information output by the host CPU 101 indicates "maximum value," then the value of N is the maximum value stored in the maximum value storage unit 107a. If the type-of-time information output by the host CPU 101 indicates "average value," then the value of N is the average value stored in the average value storage unit 107c.

In the example of FIG. 16, the time (Tprogram) required for completing the program operation for the entire group of memory cells is computed using the following equation:

$$T\text{program} = T_s + \{(T_p + T_{pv}) \cdot N\} + T_h$$

The values of Ts, Tp, Tpv, and Th are changed based on the output format information output by the host CPU 101. For example, if the output format information indicates "unit of seconds," then Ts is set to a value representing the setup time in units of seconds such as µs or ms; otherwise, if the output format information indicates "the number of system clocks," then Ts is set to the number of system clocks corresponding to the setup time. The values of Tp, Tpv, and Th are also set in a similar manner.

If the output format information indicates "number of pulses," then the rewriting-time-period computation unit 107d outputs the number of times N of pulse application itself as the data representing the required rewriting time. In this case, the process may be such that the values of Ts, Tp, Tpv, and Th are provided in advance to the host CPU 101, and the host CPU 101 computes the number of seconds or the number of system clocks corresponding to the required rewriting time using these values.

By setting the values of Tes, Tep, Tepv, Teh, and N as described below, the erasing time period (Terase) can be similarly computed using the following equation:

$$T\text{erase} = T_{es} + \{(T_{ep} + T_{epv}) \cdot N_e\} + T_{eh}$$

Figure 17:
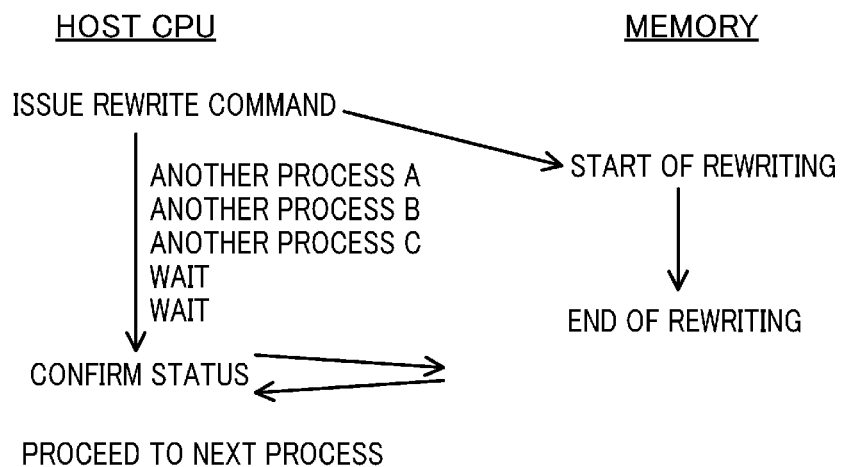
FIG. 17 is a flow diagram illustrating an example of the operations by the host CPU and by the memory when a rewrite completion time is set based on a typical value of the rewriting time period listed in the datasheet.

Tes: setup time of peripheral circuits of the memory, necessary for starting the erase operation Tep: time period during which an erase pulse is applied to that memory cell Tepv: time period during which an erase verify operation is performed Teh: hold time of peripheral circuits of the memory, necessary for completing the erase operation Ne: the number of times of application of an erase pulse Here, consider a case in which the host CPU 101 sets the rewrite completion time based on a typical value of the rewriting time period listed in datasheet such as Non-Patent Document 1. In this case, the actual rewriting time period may significantly differ from the typical value. For example, if the actual rewriting time period greatly exceeds the typical value, then as shown in FIG. 17, a problem arises in that the rewriting time period from the beginning to the end of rewriting is longer than needed, because the host CPU 101 does not confirm the completion of rewriting of data even though the memory 102 has completed rewriting of data.

Figure 18:
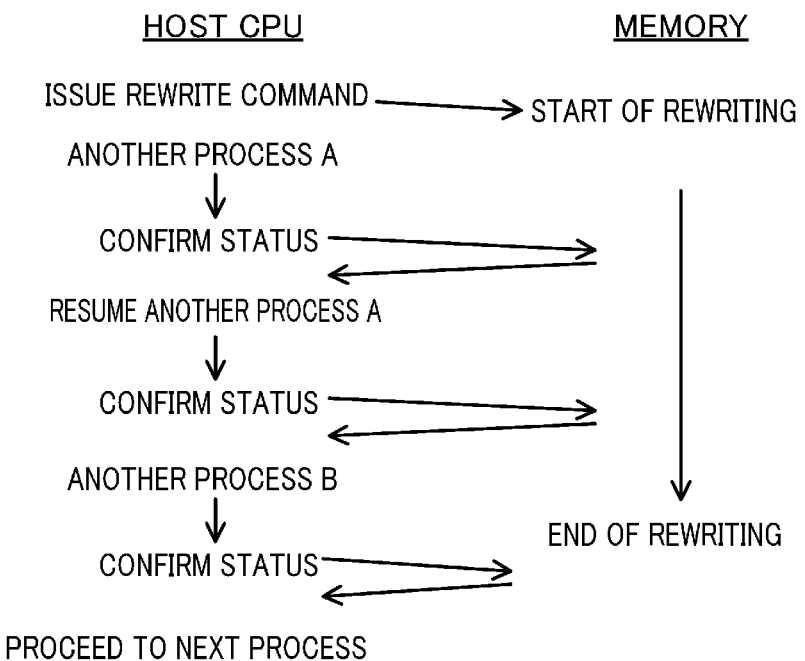
FIG. 18 is a flow diagram illustrating another example of the operations by the host CPU and by the memory when a rewrite completion time is set based on a typical value of the rewriting time period listed in the datasheet.

In addition, if the host CPU 101 periodically performs status confirmation from the beginning of rewriting, then as shown in FIG. 18, the host CPU 101 needs to repeat a status confirmation operation, thereby posing a problem of increasing a processing time of the host CPU 101 and of increasing code size.

According to this embodiment, the memory 102 performs counting during an actual rewrite operation to obtain the number of times of application of a voltage pulse, and outputs the required rewriting time based on this number of times of application, thereby enabling a required rewriting time specific to the memory 102 (chip, device) to be obtained more accurately even if manufacturing variation exists. Thus, the rewriting time period from the beginning to the end of rewriting can be reduced, and at the same time, the problem of increasing the processing time of the host CPU 101 and of increasing code size is unlikely to occur.

Moreover, since physical mechanism of a program operation and physical mechanism of an erase operation on a flash memory differ from each other (electron injection and hole injection), and also the respective numbers of target memory cells to perform a bulk program operation and a bulk erase operation may differ from each other, there are often a large difference between the programming time period and the erasing time period. According to this embodiment, the programming time period and the erasing time period are computed individually, and thus the programming time period, the erasing time period, and the sum of the programming and erasing time periods can be obtained more accurately.

Second Embodiment

Figure 19:
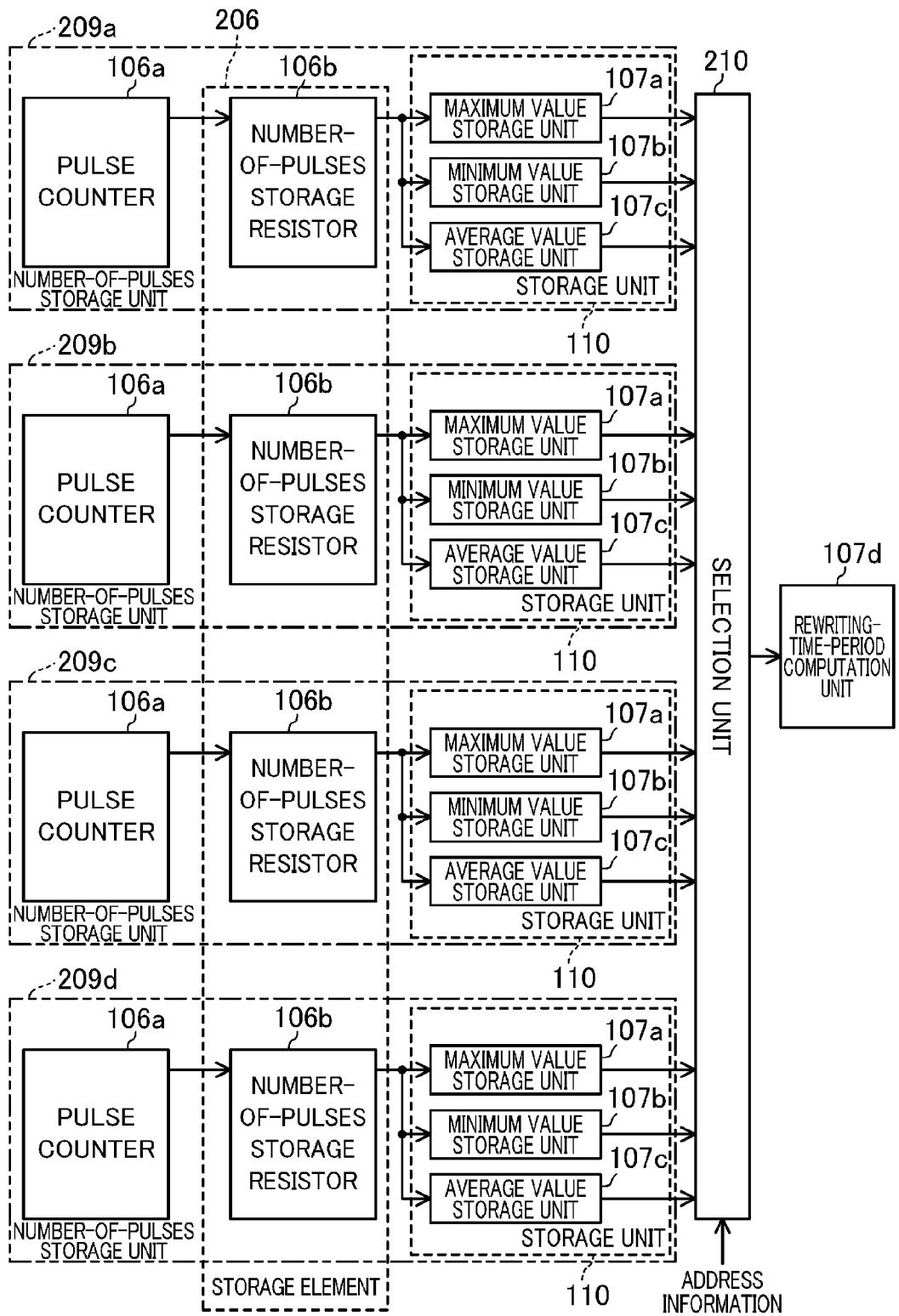
FIG. 19 is a block diagram illustrating a configuration of the number-of-pulses storage unit, the selection unit, and the rewriting-time-period computation unit according to the second embodiment of the present disclosure.

As shown in FIG. 19, the memory 102 of the memory embedded system 100 according to the second embodiment includes, instead of the number-of-pulses storage unit 109 of the first embodiment, four number-of-pulses storage units 209a-209d each having the same configuration as that of the number-of-pulses storage unit 109, and a selection unit 210.

The pulse counter 106a of the number-of-pulses storage unit 209a counts the number of times of application of a program pulse during programming on the first memory cell block 103c, and counts the number of times of application of an erase pulse during erasing on the first memory cell block 103c.

The pulse counter 106a of the number-of-pulses storage unit 209b counts the number of times of application of a program pulse during programming on the second memory cell block 103d, and counts the number of times of application of an erase pulse during erasing on the second memory cell block 103d.

The pulse counter 106a of the number-of-pulses storage unit 209c counts the number of times of application of a program pulse during programming on the third memory cell block 103e, and counts the number of times of application of an erase pulse during erasing on the third memory cell block 103e.

The pulse counter 106a of the number-of-pulses storage unit 209d counts the number of times of application of a program pulse during programming on the fourth memory cell block 103f, and counts the number of times of application of an erase pulse during erasing on the fourth memory cell block 103f.

The selection unit 210 selects the maximum, minimum, and average values stored in one of the number-of-pulses storage units 209a-209d based on the rewrite address information output from the host CPU 101, and outputs the maximum, minimum, and average values selected.

The rewriting-time-period computation unit 107d computes the required rewriting time in a similar manner to the first embodiment using a value specified by the type-of-time information output by the host CPU 101 out of the maximum, minimum, and average values output by the selection unit 210.

Also in this embodiment, operations of storing values into the maximum value storage unit 107a, into the minimum value storage unit 107b, and into the average value storage unit 107c are performed on each of the number-of-pulses storage units 209a-209d in the test phase.

The other part of the configuration is similar to that of the first embodiment, and the explanation thereof will be omitted.

Here, a case is described in which at the test phase, the values listed in Table 2 below are stored in the average value storage units 107c of the number-of-pulses storage units 209a-209d, and the type-of-time information output by the host CPU 101 indicates "average value."

TABLE 2

| Block | Number of Times of Pulse Application | Actual Required Rewriting Time |
|---|---|---|
| 1 | 12 | 12 seconds |
| 2 | 11 | 11 seconds |
| 3 | 9 | 9 seconds |
| 4 | 8 | 8 seconds |

It is assumed here that the durations of Ts and Th are significantly shorter than those of Tp and Tpv, and thus are both considered to be zero. It is also assumed that the output format information specifies to express the required rewriting time in units of seconds. The period of a program pulse (Tp+Tpv) is assumed to be one second.

If the rewrite address information output by the host CPU 101 specifies the first memory cell block 103c, then the selection unit 210 selects and outputs the average value "12" stored in the average value storage unit 107c of the number-of-pulses storage unit 209a. Therefore, the required programming time is computed by the rewriting-time-period computation unit 107d as follows: 1 (second)×12=12 (seconds).

If the rewrite address information output by the host CPU 101 specifies the second memory cell block 103d, then the selection unit 210 selects and outputs the average value "11" stored in the average value storage unit 107c of the number-of-pulses storage unit 209b. Therefore, the required programming time is computed by the rewriting-time-period computation unit 107d as follows: 1 (second)×11 (times)=11 (seconds).

According to this embodiment, the required rewriting time is computed based on the number of times of pulse application actually obtained for each of the memory cell blocks, thereby enabling the required rewriting time to be obtained more accurately even if, as with the example of Table 2, there are variations in characteristics of memory cells, and thus the number of times of pulse application varies depending on addresses, causing a difference in the required rewriting time between memory cell blocks.

Variation of Second Embodiment

In the memory embedded system 100 according to a variation of the second embodiment, the memory 102 stores the maximum, minimum, and average values of the number of pulses counted by the pulse counter 106a for rewrite operations performed in a first through fourth temperature zones.

More specifically, the pulse counter 106a of the number-of-pulses storage unit 209a counts the number of times of application of a program pulse during programming when the ambient temperature falls within the first temperature zone, and counts the number of times of application of an erase pulse during erasing when the ambient temperature falls within the first temperature zone.

The pulse counter 106a of the number-of-pulses storage unit 209b counts the number of times of application of a program pulse during programming when the ambient temperature falls within the second temperature zone, and counts the number of times of application of an erase pulse during erasing when the ambient temperature falls within the second temperature zone.

The pulse counter 106a of the number-of-pulses storage unit 209c counts the number of times of application of a program pulse during programming when the ambient temperature falls within the third temperature zone, and counts the number of times of application of an erase pulse during erasing when the ambient temperature falls within the third temperature zone.

The pulse counter 106a of the number-of-pulses storage unit 209d counts the number of times of application of a program pulse during programming when the ambient temperature falls within the fourth temperature zone, and counts the number of times of application of an erase pulse during erasing when the ambient temperature falls within the fourth temperature zone.

The selection unit 210 selects the maximum, minimum, and average values stored in one of the number-of-pulses storage units 209a-209d based on the rewrite temperature information output by the host CPU 101, and outputs the maximum, minimum, and average values selected. That is, if the rewrite temperature information indicates a temperature in the first temperature zone, then the maximum, minimum, and average values stored in the number-of-pulses storage unit 209a are selected; if the rewrite temperature information indicates a temperature in the second temperature zone, then the maximum, minimum, and average values stored in the number-of-pulses storage unit 209b are selected; if the rewrite temperature information indicates a temperature in the third temperature zone, then the maximum, minimum, and average values stored in the number-of-pulses storage unit 209c are selected; and if the rewrite temperature information indicates a temperature in the fourth temperature zone, then the maximum, minimum, and average values stored in the number-of-pulses storage unit 209d are selected.

The other part of the configuration is similar to that of the second embodiment, and the explanation thereof will be omitted.

According to this variation, the required rewriting time is computed based on the number of times of pulse application actually obtained for each of the temperature zones, thereby enabling the required rewriting time to be obtained more accurately even if the number of times of pulse application varies depending on the ambient temperature.

Third Embodiment

In the third embodiment, the rewriting-time-period computation unit 107d computes the required time based on the rewrite temperature information output by the host CPU 101.

More specifically, the rewriting-time-period computation unit 107d computes the time (Tprogram) required for completing a program operation for the entire group of memory cells using the following equation:

$$Tprogram=Ts+\{(Tp+Tpv)\cdot N\cdot Kth\}+Th$$

where Kth is a temperature adjustment factor, and is set based on, for example, Table 3 shown below.

TABLE 3

| Rewrite Temperature Information (° C.) | Temperature Adjustment Factor |
|---|---|
| −40-0 | 0.9 |
| 0-50 | 1.0 |
| 50-125 | 1.1 |

The erasing time period (Terase) can be similarly computed using the following equation:

$$Terase=Tes+\{(Tep+Tepv)\cdot Ne\cdot Kth\}+Teh$$

Values of the temperature adjustment factor are obtained in advance by characterizing the temperature dependence etc. of the memory cell 103a, and the rewriting-time-period computation unit 107d is configured to perform computation using the predetermined values of temperature adjustment factor listed in Table 3 based on the rewrite temperature information.

The other part of the configuration is similar to that of the first embodiment, and the explanation thereof will be omitted.

Here, a case is described in which the rewrite temperature information output by the host CPU 101 specifies 100° C., the type-of-time information indicates "average value," and the output format information specifies to express the required rewriting time in units of seconds. It is also assumed here that the durations of Ts and Th are significantly shorter than those of Tp and Tpv, and thus are both considered to be zero. The period of a program pulse (Tp+Tpv) is assumed to be one second.

In this case, assuming that the value stored in the average value storage unit 107c is 10, the required programming time is computed by the rewriting-time-period computation unit 107d as follows: 1 (second)×10 (times)×1.1 (temperature adjustment factor)=11 (seconds).

Figure 20:
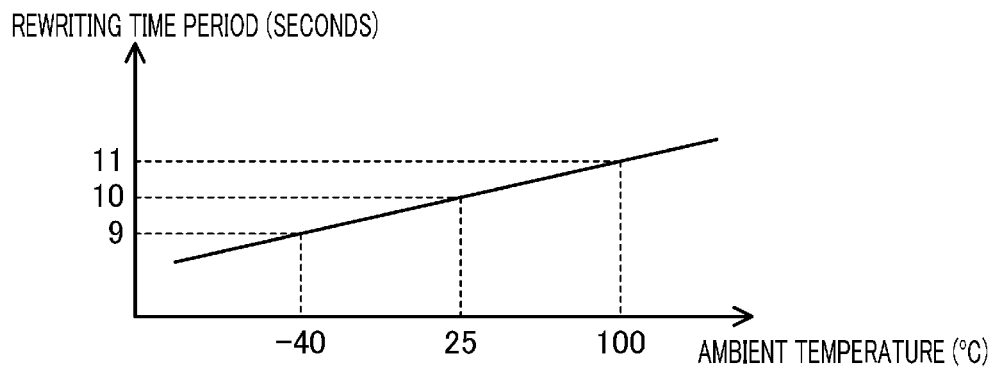
FIG. 20 is a graph illustrating an example of a relationship between the ambient temperature of the memory and the rewriting time period according to the third embodiment of the present disclosure.

FIG. 20 illustrates an example of a relationship between the ambient temperature and the rewriting time period.

In this example, the rewriting time period is 9 seconds at an ambient temperature of −40° C., 10 seconds at an ambient temperature of 25° C., and 11 seconds at an ambient temperature of 100° C. Thus, if the rewriting time period varies depending on the ambient temperature, the required time computed by the rewriting-time-period computation unit 107d may significantly differ from the rewriting time period actually required. For example, if the maximum, minimum, and average values stored in the storage unit 110 have been obtained when rewriting at an ambient temperature of 25° C., then computing the required rewriting time at an ambient temperature of 100° C. using the maximum, minimum, or average value stored in the storage unit 110 causes the computed required rewriting time to significantly differ from the rewriting time period actually required.

According to this embodiment, since the required rewriting time is computed based on the rewrite temperature information, the required rewriting time specific to the ambient temperature indicated by the rewrite temperature information can be obtained more accurately even if the ambient temperature at the time of obtaining the values stored in the storage unit 110 differs from the ambient temperature indicated by the rewrite temperature information. Moreover, the circuit area can be reduced as compared to the variation of the second embodiment because not as many number-of-pulses storage units as the number of temperature zones need to be provided.

First Variation of Third Embodiment

In the memory embedded system 100 according to a first variation of the third embodiment, the rewriting-time-period computation unit 107d computes a required rewriting time based on the rewrite address information, instead of the rewrite temperature information, output by the host CPU 101.

More specifically, the rewriting-time-period computation unit 107d computes the time (Tprogram) required for completing a program operation for the entire group of memory cells using the following equation, which uses an address adjustment factor Kad predetermined for each of the memory cell blocks by characterizing the address dependence of rewriting time period:

$$Tprogram=Ts+\{(Tp+Tpv)\cdot N\cdot Kad\}+Th$$

In this case, the erasing time period (Terase) can be similarly computed using the following equation:

$$Terase=Tes+\{(Tep+Tepv)\cdot Ne\cdot Kad\}+Teh$$

The other part of the configuration is similar to that of the third embodiment, and the explanation thereof will be omitted.

According to this variation, since the required rewriting time is computed based on the rewrite address information, the required rewriting time specific to the address of the target memory cells for the rewrite operation (i.e., address indicating the memory cell block to which the target memory cells for the rewrite operation belong) can be obtained more accurately even if a difference exists in the required rewriting time between memory cell blocks. Moreover, the circuit area can be reduced as compared to the second embodiment because not as many number-of-pulses storage units as the number of memory cell blocks need to be provided.

Second Variation of Third Embodiment

In the memory embedded system 100 according to the second variation of the third embodiment, the rewriting-time-period computation unit 107d computes a required rewriting time based on the program data pattern instead of the rewrite temperature information. The rewriting time period increases with the number of bits to be inverted from the erase state to the program state. Therefore, the rewriting-time-period computation unit 107d computes the time (Tprogram) required for completing a program operation for the entire group of memory cells using the following equation, which uses a factor Kdata which increases with the number of data bits to be programmed.

$$T\text{program}=Ts+\{(Tp+Tpv)\cdot N\cdot K\text{data}\}+Th$$

In this case, the erasing time period (Terase) can be similarly computed using the following equation:

$$T\text{erase}=Tes+\{(Tep+Tepv)\cdot Ne\cdot K\text{data}\}+Teh$$

The other part of the configuration is similar to that of the third embodiment, and the explanation thereof will be omitted.

According to this variation, since the required rewriting time is computed based on the program data pattern, the required rewriting time specific to the program data pattern which is the target of the rewrite operation can be obtained more accurately.

Fourth Embodiment

Figure 21:
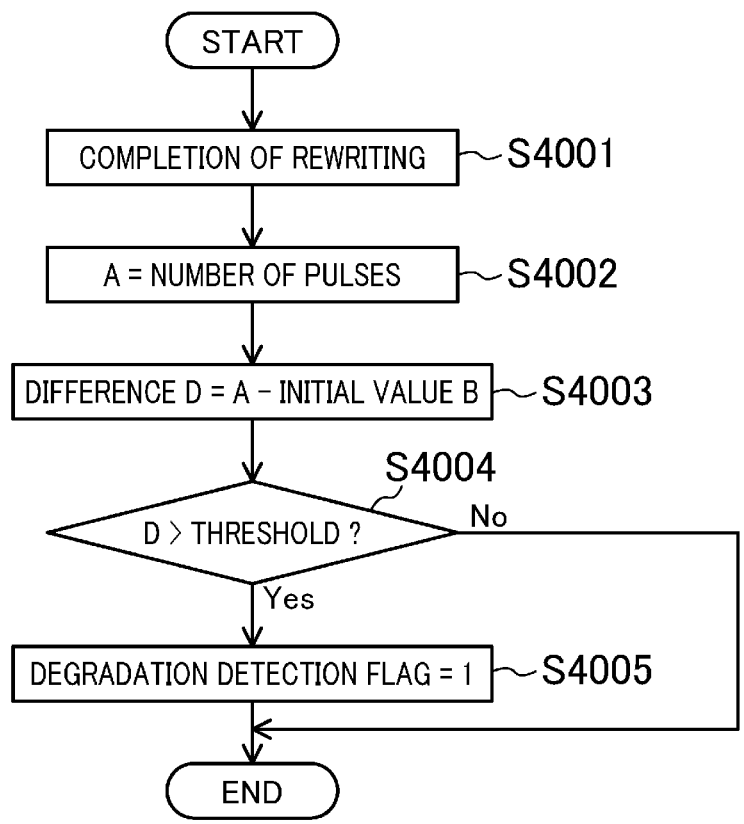
FIG. 21 is a flowchart illustrating an operation performed, for each completion of a rewrite operation, by the memory according to the fourth embodiment of the present disclosure.

In the fourth embodiment, the memory 102 performs the process illustrated in the flowchart of FIG. 21 upon each completion of a rewrite operation.

When a rewrite operation completes at step S4001 by the memory 102, first, at step S4002, the rewriting-time-period computation unit 107d sets to a parameter "a" the count value obtained by a count operation of the pulse counter 106a for the rewrite operation completed at step S4001 (most recent rewrite operation). Next, at step S4003, the rewriting-time-period computation unit 107d sets to a parameter "d" the difference between the value of the parameter a and a count value b obtained by a count operation of the pulse counter 106a for a predetermined rewrite operation completed prior to the most recent rewrite operation. Next, at step S4004, the rewriting-time-period computation unit 107d determines whether the value of the parameter d is or is not greater than a predetermined threshold. If the value of the parameter d is greater than the predetermined threshold, then the rewriting-time-period computation unit 107d sets a degradation detection flag (to "1") at step S4005, while if the value of the parameter d is equal to or less than the predetermined threshold, then the process terminates.

Figure 22:
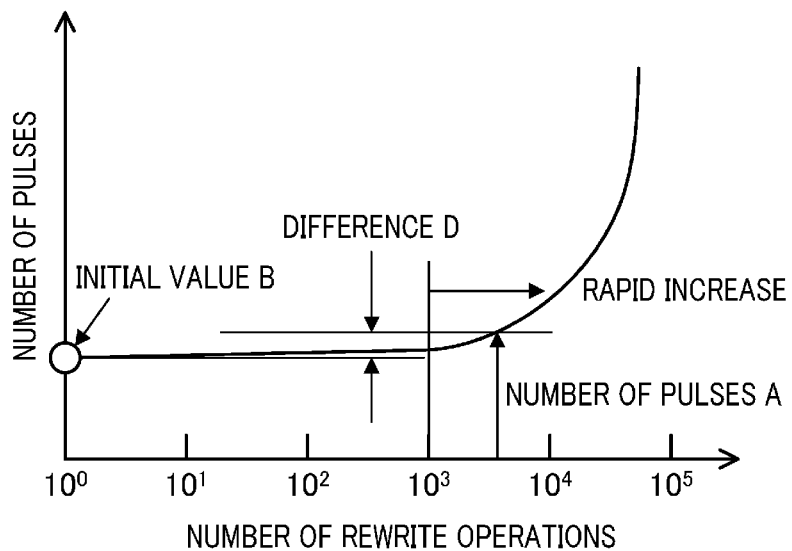
FIG. 22 is a graph illustrating an example of a relationship between the number of rewrite operations and the number of pulses required for each rewrite operation with respect to the memory according to the fourth embodiment of the present disclosure.

FIG. 22 illustrates an example of a relationship between the number of rewrite operations and the number of pulses required for each rewrite operation. In the example of FIG. 22, the number of pulses tends to dramatically increase with the number of rewrite operations after the number of rewrite operations exceeds $10^3$. This tendency results from degradation of the memory cell 103a. If the number of rewrite operations and the number of pulses required for each rewrite operation has the relationship of FIG. 22, then the threshold value of step S4004 is set to the number of pulses corresponding to the number of rewrite operations of $10^3$.

Figure 23:
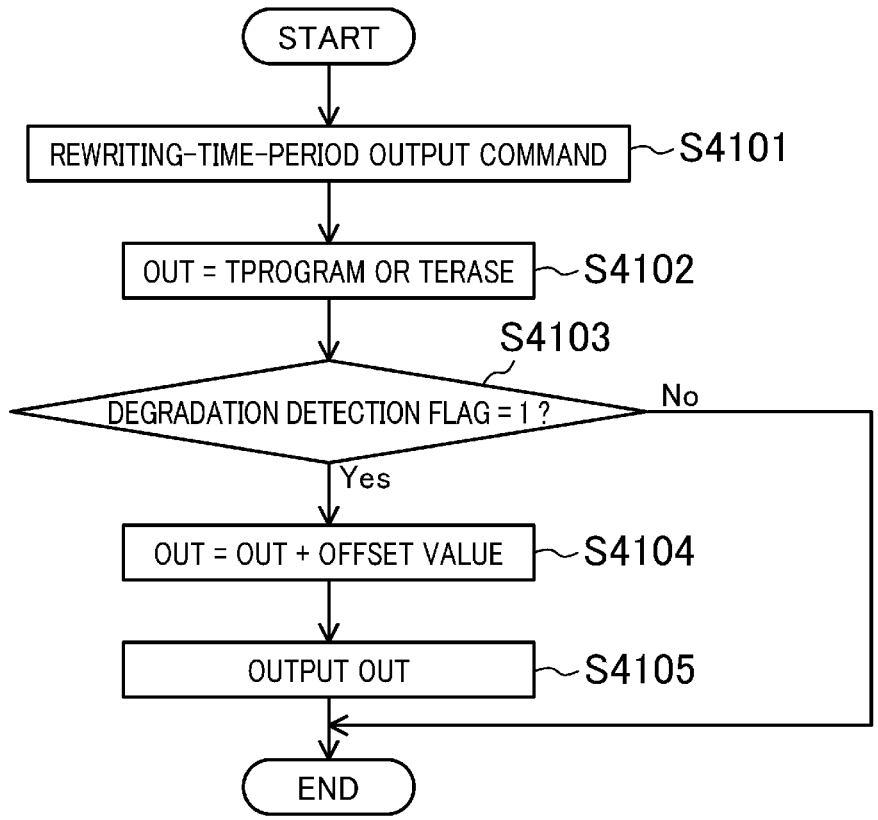
FIG. 23 is a flowchart illustrating a method for computing the required rewriting time by the rewriting-time-period computation unit according to the fourth embodiment of the present disclosure.

Next, a method for computing a required time performed by the rewriting-time-period computation unit 107d will be described referring to the flowchart of FIG. 23.

First, a rewriting-time-period output command is issued by the host CPU 101 at step S4101, then at step S4102, the rewriting-time-period computation unit 107d computes the rewriting time period (Tprogram or Terase) using the method of the first embodiment, and stores the computed rewriting time period in a parameter "out." Next, at step S4103, the rewriting-time-period computation unit 107d determines whether the degradation detection flag is "1" or not. If the degradation detection flag is "1," then the process proceeds to step S4104, while if the degradation detection flag is not "1," then the process proceeds to step S4105. At step S4104, an offset value is added to the value of the parameter out, and then the process proceeds to step S4105. At step S4105, the value of the parameter out is output as the required time for the rewrite operation, then the process terminates.

The other part of the configuration is similar to that of the first embodiment, and the explanation thereof will be omitted.

Instead of using the degradation detection flag, the method may be such that a multi-bit degradation level signal which represents the level of degradation in three or more stages is held, and the method for computing a required time performed by the rewriting-time-period computation unit 107d can be switched based on the value of the degradation level signal.

In addition, although this embodiment adds an offset value to the value of the parameter out, the operation at step S4104 may be a multiplication by a predetermined factor, a combination operation of an addition and a multiplication, or an operation using another function.

According to this embodiment, a similar advantage to the first embodiment can be provided. Moreover, since the required rewriting time is computed taking into account the change in rewriting time period dependent on the number of rewrite operations, the required rewriting time can be obtained more accurately.

Fifth Embodiment

Figure 24:
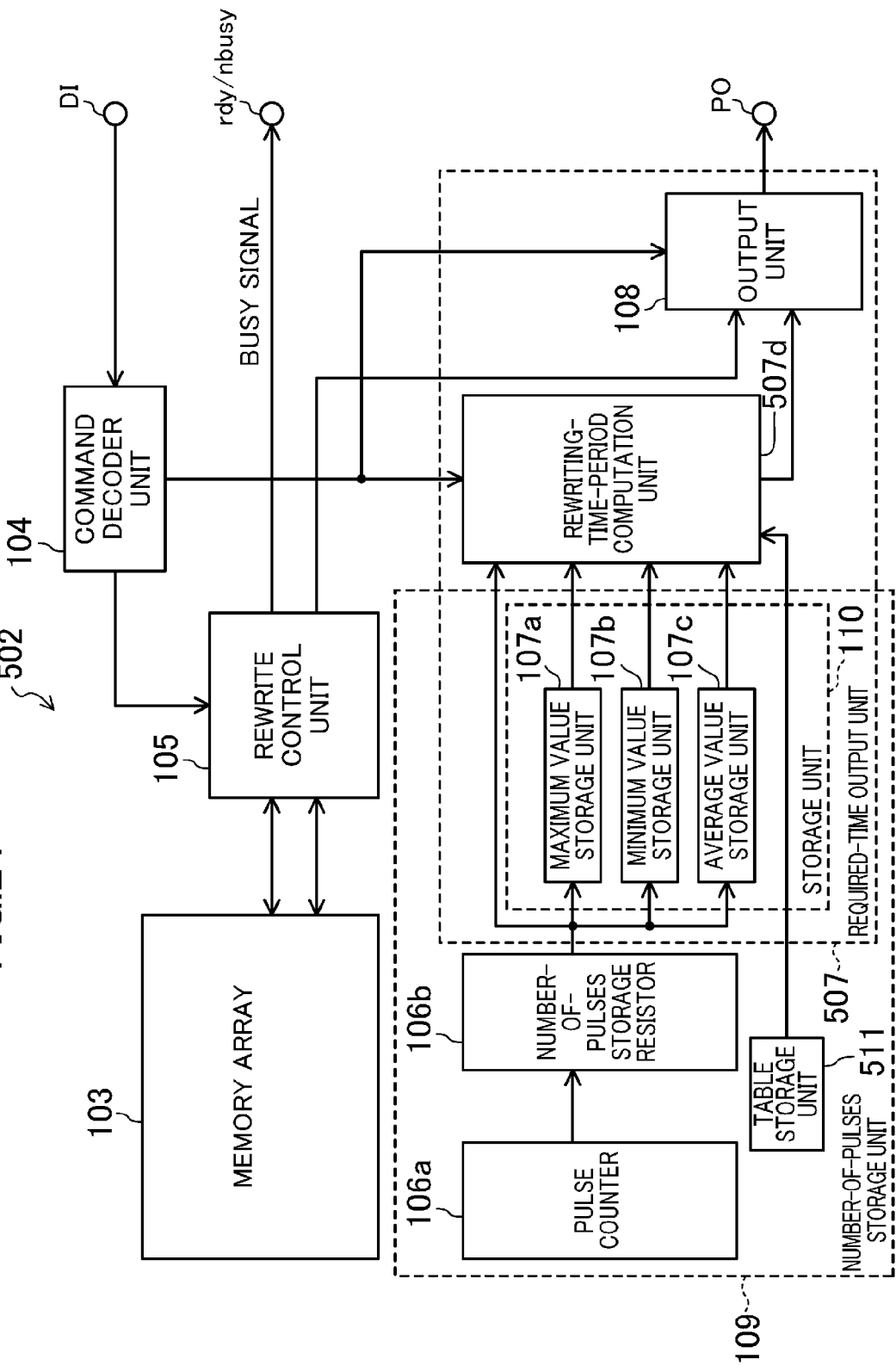
FIG. 24 is a block diagram illustrating a configuration of the memory according to the fifth embodiment of the present disclosure.

The memory embedded system 100 according to the fifth embodiment includes a memory 502 instead of the memory 102 of the first embodiment. As shown in FIG. 24, the memory 502 includes a table storage unit 511 in addition to the components of the memory 102 of the first embodiment, and includes a required-time output unit 507 instead of the required-time output unit 107 of the first embodiment.

The table storage unit 511 stores a table showing a relationship between the number of rewrite operations and the number of pulses. Table 4 shown below is an example of the table stored in the table storage unit 511. The table of Table 4 lists three value ranges of the number of rewrite operations and the numbers of pulses respectively corresponding to the value ranges. The number of pulses corresponding to the value range C0-D0 is T0; the number of pulses corresponding to the value range C1-D1 is T1; and the number of pulses corresponding to the value range C2-D2 is T2.

TABLE 4

| Number of Rewrite Operations | Number of Pulses |
|---|---|
| C0-D0 | T0 |
| C1-D1 | T1 |
| C2-D2 | T2 |

The required-time output unit 507 differs from the required-time output unit 107 of the first embodiment in including a rewriting-time-period computation unit 507d instead of the rewriting-time-period computation unit 107d.

The rewriting-time-period computation unit 507d can perform not only the method for computing the required time of the first embodiment, that is, the computing method using the values stored in one of the maximum value storage unit 107a, the minimum value storage unit 107b, and the average value storage unit 107c, but also a computing method described below using the table stored in the table storage unit 511. The determination of which of the computing method of the first embodiment and the computing method using the table described above is made based on, for example, a control signal output by the host CPU 101.

The rewriting-time-period computation unit 507d receives the number-of-rewrites information output by the host CPU 101, and identifies the value range which includes the number of rewrite operations indicated by the number-of-rewrites information. Thereafter, the rewriting-time-period computation unit 507d further identifies the number of pulses associated with the identified value range in the table, and computes the required rewriting time based on the number of pulses identified.

Figure 25:
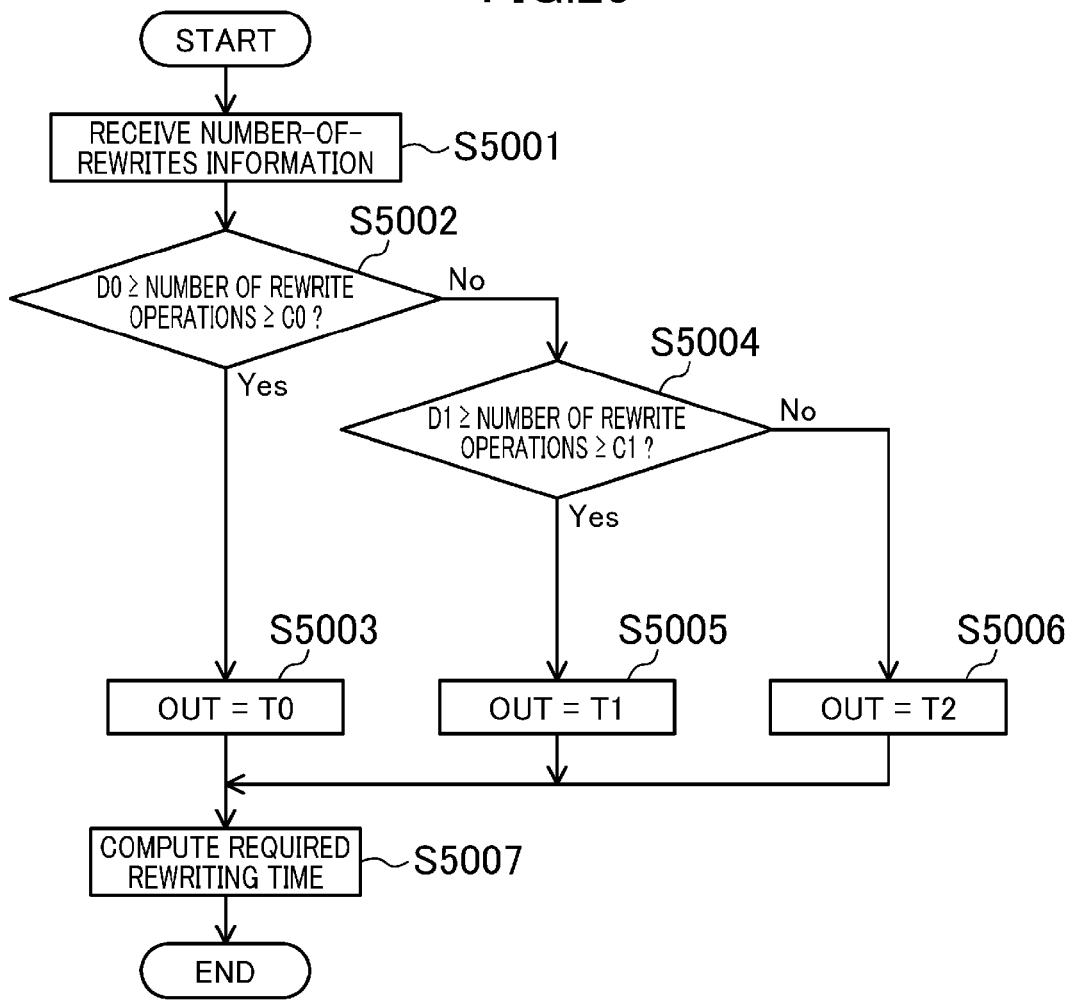
FIG. 25 is a flowchart illustrating an operation of the rewriting-time-period computation unit according to the fifth embodiment of the present disclosure.

FIG. 25 is a flowchart illustrating an operation of the rewriting-time-period computation unit 507d.

First, at step S5001, the rewriting-time-period computation unit 507d receives number-of-rewrites information output from the host CPU 101. Next, at step S5002, it is determined whether or not the number of rewrite operations indicated by the number-of-rewrites information received at step S5001 falls within the value range from C0 (inclusive) to D0 (inclusive). If the number falls within this value range, the process proceeds to step S5003, while if the number does not fall within this value range, the process proceeds to step S5004. At step S5003, the number of pulses T0 associated with the value range from C0 (inclusive) to D0 (inclusive) in the table is set to the parameter out, and the process proceeds to step S5007. At step S5004, it is determined whether or not the number of rewrite operations indicated by the number-of-rewrites information received at step S5001 falls within the value range from C1 (inclusive) to D1 (inclusive). If the number falls within this value range, the process proceeds to step S5005, while if the number does not fall within this value range, the process proceeds to step S5006. At step S5005, the number of pulses T1 associated with the value range from C1 (inclusive) to D1 (inclusive) in the table is set to the parameter out, and the process proceeds to step S5007. At step S5006, the number of pulses T2 associated with the value range from C2 (inclusive) to D2 (inclusive) in the table is set to the parameter out, and the process proceeds to step S5007. At step S5007, the required rewriting time is computed based on the number of pulses out.

Figure 26:
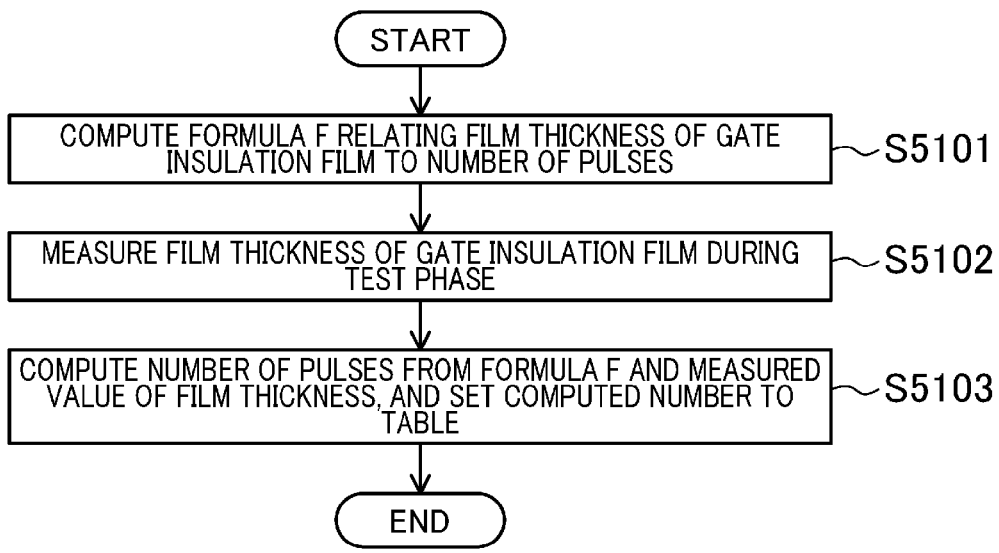
FIG. 26 is a flowchart illustrating a method for setting the number of pulses in the table according to the fifth embodiment of the present disclosure.

FIG. 26 illustrates a method for setting the number of pulses in the table stored in the table storage unit 511.

Figure 27:
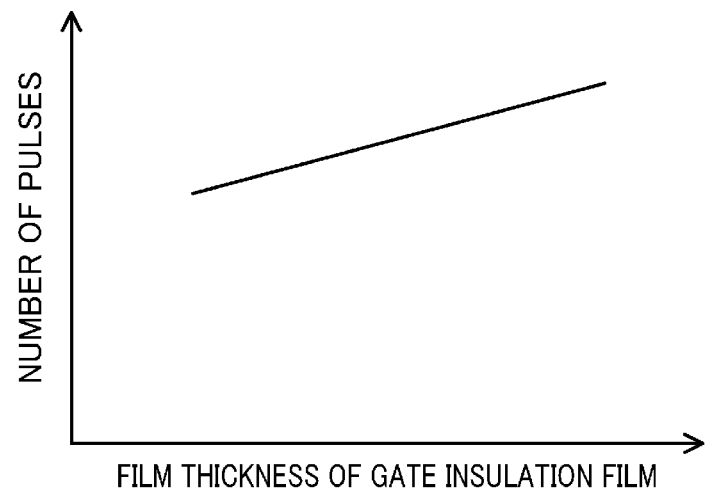
FIG. 27 is a graph illustrating an example of the relationship between the number of pulses for the Nth rewrite operation and the film thickness of a gate insulation film with respect to the memory according to the fifth embodiment of the present disclosure.

At step S5101, values of film thicknesses of gate oxide films and values of the number of pulses after N rewrite operations with respect to a plurality of memories 102 fabricated using a same fabrication means are acquired in advance, and a formula f relating the film thickness of a gate oxide film to the number of pulses is computed based on these data. FIG. 27 illustrates an example of the relationship between the number of pulses for the Nth rewrite operation and the film thickness of a gate insulation film. Next, at step S5102, the film thickness of the gate insulation film of the target memory 102 for setting the table is measured during the test phase. At step S5103, the number of pulses of the Nth rewrite operation on the target memory 102 for setting the table is computed based on the formula f computed at step S5101 and on the film thickness measured at step S5102. The number of pulses computed is set as the number of pulses corresponding to the value range including the number N.

The other part of the configuration and the other part of the operation are similar to those of the first embodiment, and the explanation thereof will be omitted.

Figure 28:
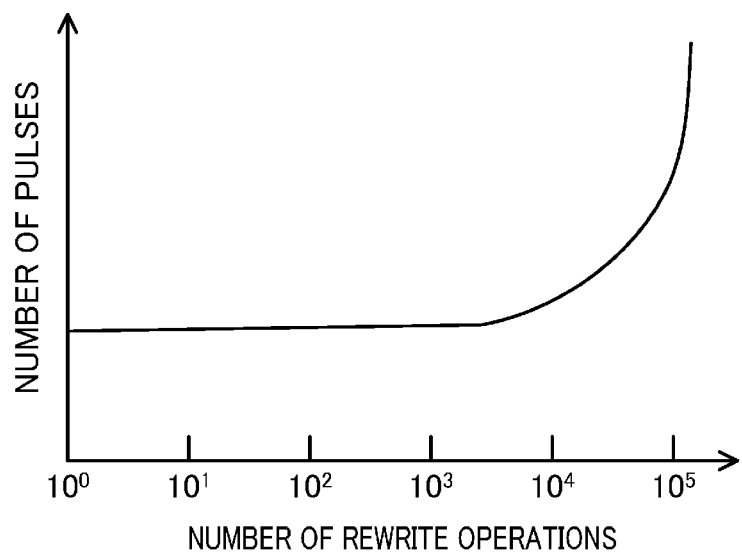
FIG. 28 is a graph illustrating an example of the relationship between the number of pulses and the number of rewrite operations for the memory according to the fifth embodiment of the present disclosure.

In general, since transistors included in a flash memory are degraded by repeating rewrite operations, the required rewriting time of a flash memory changes depending on the number of rewrite operations. FIG. 28 is a graph illustrating an example of the relationship between the number of pulses and the number of rewrite operations. In FIG. 28, the number of pulses starts to increase after the number of rewrite operations exceeds $10^3$, and dramatically increases as the number of rewrite operations approaches $10^5$. Thus, since the increase in the number of pulses with an increase in the number of rewrite operations changes depending on the number of rewrite operations, it is preferable that the thresholds of the number of rewrite operations, such as D0, D1, etc., of FIG. 25 be determined taking into account the rate of the increase in the number of pulses (i.e., the required rewriting time). For example, the threshold D0 may be set to $10^3$ at which the number of pulses starts to increase, and the threshold D1 may be set to $10^4$ after which the increase in the number of pulses becomes gradually more rapid.

According to this embodiment, since the table is set for each memory 102 (chip), and the required rewriting time is computed based on the number of pulses associated with the number of rewrite operations in the table, an accurate required rewriting time dependent on characteristics of each memory 102 and on the number of rewrite operations can be obtained.

Sixth Embodiment

In the memory embedded system 100 according the sixth embodiment, the memory 102 performs the operation of computing the required rewriting time in the rewriting-time-period computation unit 107d in response to the issuance of a rewrite command by the host CPU 101, outputs the required rewriting time to the data bus (terminal) DIO as a part of rewrite status information, and starts to rewrite data. Meanwhile, the host CPU 101 receives the required rewriting time output by the memory 102, and sets a rewrite completion time based on the required rewriting time. The host CPU 101 then performs a process or processes other than confirmation of the completion of rewriting until the rewrite completion time set is reached, and after the rewrite completion time is reached, the host CPU 101 confirms the completion of rewriting.

The rewrite status information described above is 16-bit information having a configuration shown in Table 5 below.

TABLE 5

| DIO | Description |
|---|---|
| 0 | Not in Use |
| 1 | Buffer Abort |
| 4:2 | Not in Use |
| 5 | Fail |
| 6 | Toggle |
| 7 | Polling |
| 15:8 | EW time (unit: 100 μs) |

A completion of programming is confirmed using the toggle bit, which is output to DIO[6], or the polling bit, which is output to DIO[7]. The value representing the required rewriting time is output to DIO[15:8].

Figure 29:
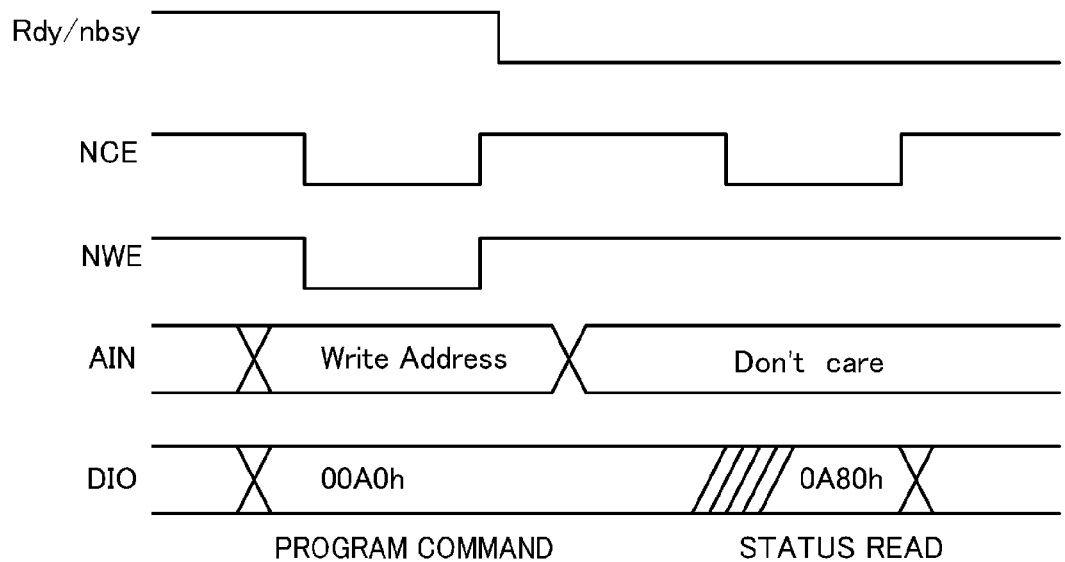
FIG. 29 is a timing chart illustrating an example of an operation of transmitting and receiving signals performed between the host CPU and the memory when a program command is issued by the host CPU according to the sixth embodiment of the present disclosure.

FIG. 29 illustrates an example of an operation of transmitting and receiving signals performed between the host CPU 101 and the memory 102 when a program command is issued by the host CPU 101.

First, the host CPU 101 outputs a value A0h indicating "program command" to the data bus (terminal) DIO, and outputs low (L) level as the access signal NCE and the write enable signal NWE to the memory 102. Thus, the memory 102 transitions to a program execution state, and drives the signal to the terminal rdy/nbusy low, thereby indicating that an operation is being performed. Next, while the terminal rdy/nbusy is maintained at an L level, the host CPU 101 drives the access signal NCE low while maintaining the write enable signal NWE at an H level. In response to this, the memory 102 outputs a value 0A80h to the data bus DIO as the rewrite status information.

Thus, a description has been provided in terms of an operation of transmitting and receiving signals performed upon issuance of a program command. Signal transmission and reception operation is performed in a similar manner upon issuance of an erase command.

The other part of the configuration and the other part of the operation are similar to those of the first embodiment, and the explanation thereof will be omitted.

According to this embodiment, the host CPU 101 can receive the required rewriting time from the memory 102 upon rewriting without issuing a special command such as the rewriting-time-period output command of the first embodiment. This allows the CPU control program of the host CPU 101 to be simplified.

The memory embedded system 100 according to this sixth embodiment may include a register for storing a value output to the data bus DIO. Further, this register may be configured so that the required rewriting time computed based on the number of pulses (maximum, minimum, or average value) measured during the test phase of fabrication process is first stored as an initial value. In addition, the value stored in this register may be updated when a rewrite operation is performed after shipment.

The features of this embodiment may also be applied to the second through fifth embodiments and to the variations thereof.

Seventh Embodiment

In the memory embedded system 100 according to the seventh embodiment, the host CPU 101 issues a read status register command.

In addition, the rewriting-time-period computation unit 107d of the memory 102 includes a status register. The status register stores the rewrite status information, the required programming time, and the required erasing time. As shown in Table 6 below, the status register outputs the rewrite status information when the address input AIN is 00h, outputs the required programming time when the address input AIN is 01h, and outputs the required erasing time when the address input MN is 02h. Note that the required rewriting time stored in the status register in this embodiment is the required time for a program operation for a single rewrite command.

TABLE 6

| DIO | AIN[7:0] = 00h | AIN[7:0] = 01h | AIN[7:0] = 02h |
|---|---|---|---|
| 0 | Not in Use | DIO[15:0] = | DIO[15:0] = |
| 1 | Buffer Abort | Required | Required |
| 4:2 | Not in Use | Programming Time | Erasing Time |
| 5 | Fail | (unit: μs) | (unit: μs) |
| 6 | Toggle | | |
| 7 | Polling | | |
| 15:8 | Unknown | | |

The initial value first stored in the status register is the required rewriting time computed based on the number of pulses (maximum, minimum, or average value) measured during the test phase of fabrication process. Therefore, the required rewriting time in an initial state (i.e., required rewriting time based on the measurement result during the test phase) can be output to the status register before the first rewrite operation after shipment. In addition, the value stored in the status register is updated when a rewrite operation is performed after shipment.

Figure 30:
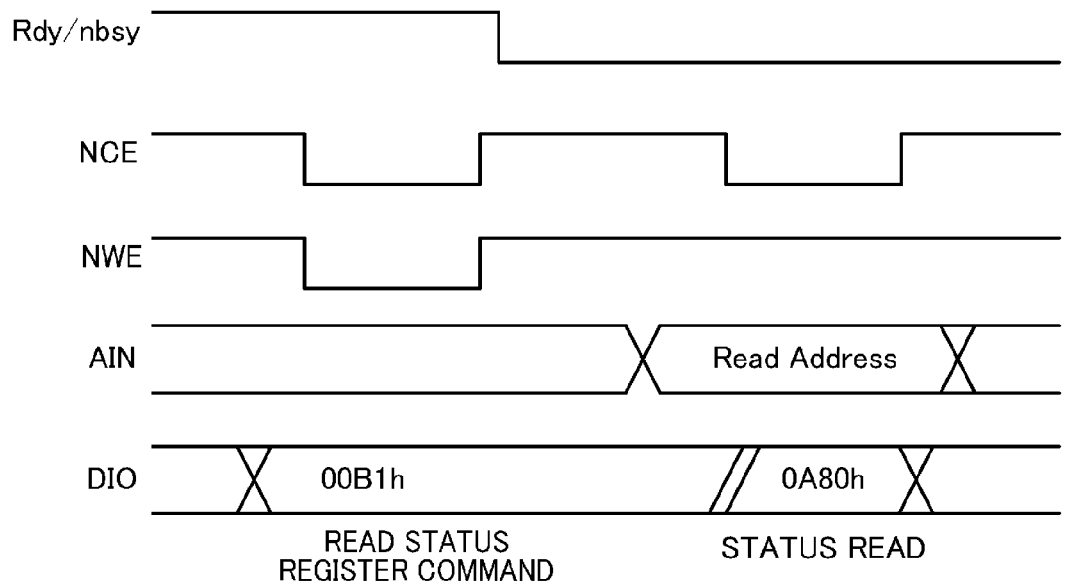
FIG. 30 is a timing chart illustrating an example of an operation of transmitting and receiving signals performed between the host CPU and the memory when a read status register command is issued by the host CPU according to the seventh embodiment of the present disclosure.

FIG. 30 illustrates an example of an operation of transmitting and receiving signals performed between the host CPU 101 and the memory 102 when a read status register command is issued by the host CPU 101.

First, the host CPU 101 outputs a value 00B1h indicating "read status register command" to the data bus DIO, and outputs low level as the access signal NCE and the write enable signal NWE to the memory 102. Thus, the memory 102 transitions to a read status register mode (read mode). After a predetermined time has elapsed, the host CPU 101 drives high both the access signal NCE and the write enable signal NWE. Next, the host CPU 101 outputs the value 00h, 01h, or 02h as the address input AIN, and under this condition, drives the access signal NCE low while maintaining the write enable signal NWE at an H level. In response to this, the memory 102 outputs the value stored in the status register (0A80h in the example of FIG. 30) to the data bus DIO.

The other part of the configuration and the other part of the operation are similar to those of the first embodiment, and the explanation thereof will be omitted.

According to this embodiment, by outputting a predetermined value to the address input AIN to read the status register, the host CPU 101 can easily and flexibly obtain the required rewriting time. Moreover, issuance of a single command can obtain both the required programming and erasing times.

In addition to the required time for a rewrite operation for a single rewrite command, the status register may further store a required programming time for data in other units, such as the required time for a program operation corresponding to a single address (word program), the required time for a program operation corresponding to more than one address (write buffer program), and may output such a required programming time by specifying it using the address input AIN.

The features of this embodiment may also be applied to the second through fifth embodiments and to the variations thereof.

In the first through seventh embodiments described above, the rewriting-time-period computation unit 107d of the memory 102 outputs data of computed required rewriting time expressed in units of seconds or the number of system clocks. However, as shown in Table 7 below, data specifying a value range which includes the required rewriting time may be output.

TABLE 7

| Tprogram [seconds] | Output Value |
|---|---|
| Tprogram ≤ T1 | 00h |
| T1 < Tprogram ≤ T2 | 01h |
| T2 < Tprogram ≤ T3 | 02h |
| T3 < Tprogram ≤ T4 | 03h |
| T4 < Tprogram ≤ T5 | 04h |
| T5 < Tprogram ≤ T6 | 05h |
| T6 < Tprogram | 06h |

T1 < T2 < T3 < T4 < T5 < T6

Further, in the first embodiment, the host CPU 101 may be configured not to output the required-time parameters. In such a case, the operation of transmitting and receiving signals performed between the host CPU 101 and the memory 102 when a rewriting-time-period output command is issued by the host CPU 101 is performed, for example, in a manner shown in FIG. 31.

Figure 31:
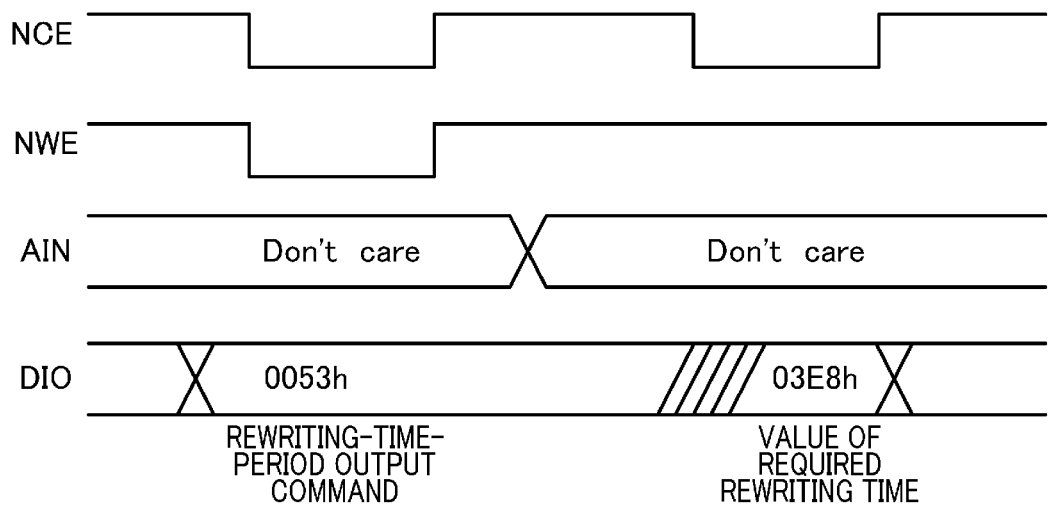
FIG. 31 is a timing chart illustrating an example of an operation of transmitting and receiving signals performed between the host CPU and the memory when a rewriting-time-period output command is issued by the host CPU according to a variation of the first embodiment of the present disclosure.

In FIG. 31, first, the host CPU 101 outputs a value 53h indicating "rewriting-time-period output command" to the data bus DIO, and outputs low level as the access signal NCE and the write enable signal NWE to the memory. After a predetermined time has elapsed, the host CPU 101 drives high both the access signal NCE and the write enable signal NWE. Next, the host CPU 101 drives the access signal NCE low while maintaining the write enable signal NWE at an H level, and the memory 102 outputs the required rewriting time 03E8h, computed by the rewriting-time-period computation unit 107d, to the data bus DIO.

Further, also in the second embodiment and in the first variation of the third embodiment, the host CPU 101 may be configured not to output the required-time parameters. In such a case, the operation of transmitting and receiving signals performed between the host CPU 101 and the memory 102 when a rewriting-time-period output command is issued by the host CPU 101 is performed, for example, in a manner shown in FIG. 32.

Figure 32:
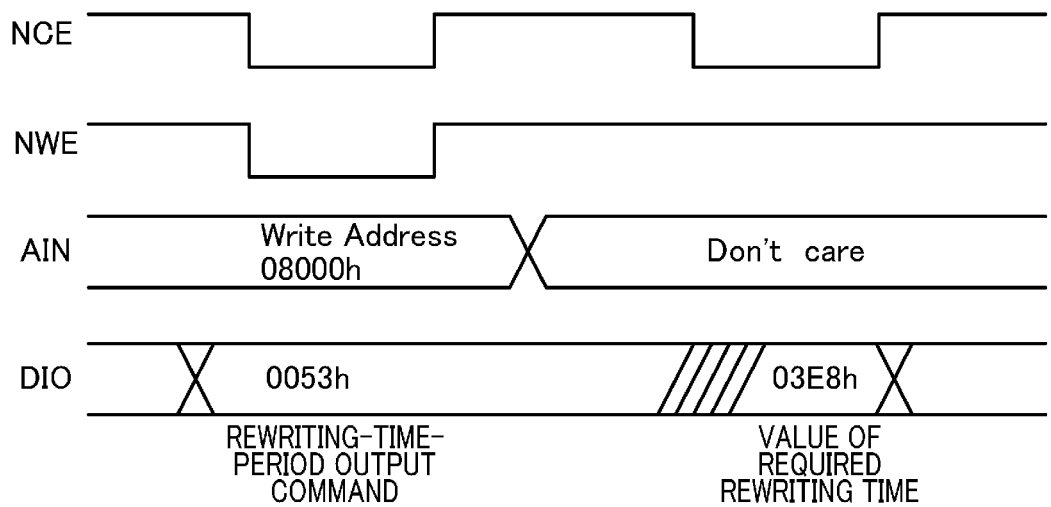
FIG. 32 is a timing chart illustrating an example of an operation of transmitting and receiving signals performed between the host CPU and the memory when a rewriting-time-period output command is issued by the host CPU according to variations of the second and third embodiment of the present disclosure.

In FIG. 32, the host CPU 101 outputs a value 08000h as the address input AIN representing the area for which the required rewriting time needs to be obtained when a rewriting-time-period output command is issued by the host CPU 101. Receiving this address input AIN, the memory 102 can output the required rewriting time dependent on the address.

Although the first through seventh embodiments and the variations thereof each count the number of pulses by the pulse counter including the D flip-flops 106c, the count operation of the number of pulses and the store operation of the count value into the number-of-pulses storage resistor 106b may be performed by a software program executed by a microcontroller.

The memory 102 does not necessarily need to be a non-volatile flash memory, but may be another type of memory such as an electrically erasable and programmable read only memory (EEPROM) or a ferroelectric random access memory (FeRAM).

In the first through seventh embodiments and the variations thereof, the memory 102 outputs a required time which is computed using one of the maximum, minimum, and average values of the number of pulses. However, the configuration may be such that the memory 102 outputs two or three of the required times respectively computed using the maximum value, using the minimum value, and using the average value, and that the host CPU 101 selects and uses one of the required times output.

In the first through seventh embodiments and the variations thereof, the number of pulses is set by actually counting upon rewriting for each chip. However, the method may be such that one or more chips are sampled for each lot or wafer, the number of pulses is obtained by actually counting with the sampled chip or chips, and the number of pulses obtained is set to all the chips included in each lot or wafer, or to chips adjacent to the sampled chip or chips. Also, the method may be such that a relationship between a measurement result of pulse code modulation (PCM) etc. and the number of pulses is revealed, the number of pulses is computed based on this relationship and on an actual measurement result and is set during fabrication.

The present disclosure can also be applied in a case in which a multi-value scheme is used in the memory 102. That is, in the first through seventh embodiments and the variations thereof, the memory cell 103a stores either of the two values: 1 or 0; however, the memory cell 103a may selectively store one of three or more values.

The memory unit and the method for controlling a CPU of the present disclosure is useful as technology for outputting a required time for a rewrite operation by the memory unit, and is applicable to, for example, a storage medium such as an SD card or a USB memory, which uses more than one memory having specifications different from each other, and a system whose ambient temperature is significantly varies, such as an in-vehicle system.

What is claimed is:

1. A memory unit having a memory array having a plurality of memory cells which each store one of at least two values including a first value and a second value, where the memory unit performs a rewrite operation by repeating application of a rewrite voltage pulse and verification, comprising:
   a storage element configured to store a number of times of the application of the rewrite voltage pulse into the memory array; and
   a required-time output unit configured to output data representing a required time for the rewrite operation based on the number of times of the application of the rewrite voltage pulse stored in the storage element,
   wherein the required-time output unit includes a storage unit configured to store a maximum value, a minimum value, and an average value of the numbers of times of the application of the rewrite voltage pulse stored in the storage element with respect to a plurality of rewrite operations, and computes the required time for the rewrite operation based on one of the maximum value, the minimum value, or the average value stored in the storage unit.

2. The memory unit of claim 1, wherein:
   the storage element stores a plurality of the numbers of times of the application of the rewrite voltage pulse, and
   the required-time output unit computes the required time for the rewrite operation based on at least one of the plurality of the numbers of times of the application of the rewrite voltage pulse stored in the storage element.

3. The memory unit of claim 2, wherein:
   the memory array has a plurality of address areas,
   the storage element stores, for each of the address areas, the number of times of the application of the rewrite voltage pulse with respect to the rewrite operation on memory cells included in the address area, and
   the required-time output unit computes the required time for the rewrite operation based on the number of times of the application of the rewrite voltage pulse for one of the address areas, of the numbers of times of the application of the rewrite voltage pulse for the respective address areas stored in the storage element.

4. The memory unit of claim 2, wherein:
   the storage element stores the numbers of times of the application of the rewrite voltage pulse with respect to a plurality of rewrite operations at ambient temperatures different from one another, and
   the required-time output unit computes the required time for the rewrite operation based on the number of times of the application of the rewrite voltage pulse at one of the ambient temperatures, of the numbers of times of the application of the rewrite voltage pulse at the respective ambient temperatures stored in the storage element.

5. The memory unit of claim 2, wherein
   the storage element stores the number of times of the application of the rewrite voltage pulse for each of a first rewrite operation to rewrite a value stored in a memory cell from the first value to the second value, and a second rewrite operation to rewrite the value stored in the memory cell from the second value to the first value.

6. The memory unit of claim 5, wherein
the required-time output unit computes the required time for the first rewrite operation based on the number of times of the application of the rewrite voltage pulse stored in the storage element with respect to the first rewrite operation, and computes the required time for the second rewrite operation based on the number of times of the application of the rewrite voltage pulse stored in the storage element with respect to the second rewrite operation.

7. The memory unit of claim 5, wherein
the required-time output unit computes a sum of the required time for the first rewrite operation and the required time for the second rewrite operation based on the number of times of the application of the rewrite voltage pulse stored in the storage element with respect to the first rewrite operation and on the number of times of the application of the rewrite voltage pulse stored in the storage element with respect to the second rewrite operation.

8. The memory unit of claim 1, wherein
the data representing the required time output by the required-time output unit is the number of times of the application of the rewrite voltage pulse corresponding to the required time.

9. The memory unit of claim 1, wherein
the data representing the required time output by the required-time output unit is expressed in units of seconds.

10. The memory unit of claim 1, wherein
the data representing the required time output by the required-time output unit is a number of system clocks corresponding to the required time.

11. The memory unit of claim 1, wherein
the required-time output unit computes the required time for the rewrite operation based on the number of times of the application of the rewrite voltage pulse and on an ambient temperature.

12. The memory unit of claim 1, wherein
the required-time output unit computes the required time for the rewrite operation based on the number of times of the application of the rewrite voltage pulse and on an address of a target memory cell for the rewrite operation for which the required time is to be computed.

13. The memory unit of claim 1, wherein
the required-time output unit computes the required time for the rewrite operation based on a difference between the number of times of the application of the rewrite voltage pulse stored in the storage element with respect to a rewrite operation for which the required time is to be computed and the number of times of the application of the rewrite voltage pulse stored in the storage element with respect to a rewrite operation performed prior to the rewrite operation for which the required time is to be computed.

14. The memory unit of claim 1, wherein the required-time output unit computes the required time for the rewrite operation based on the number of times of the application of the rewrite voltage pulse and on a program data pattern.

15. A method for controlling a CPU in a memory embedded system having the memory unit of claim 1 and the CPU, which issues a rewrite command, where the memory unit starts the rewrite operation in response to issuance of the rewrite command by the CPU, comprising:
causing the CPU to perform the following steps:
receiving the data representing the required time output by the required-time output unit of the memory unit,
performing at least one process other than confirming a completion of the rewrite operation with the memory unit until the required time elapses after the issuance of the rewrite command, and
confirming the completion of the rewrite operation with the memory unit after the required time has elapsed since the issuance of the rewrite command.

16. A memory unit having a memory array having a plurality of memory cells which each store one of at least two values including a first value and a second value, where the memory unit performs a rewrite operation by repeating application of a rewrite voltage pulse and verification, comprising:
a table storage unit configured to store a table containing both a plurality of value ranges of a number of rewrite operations since manufacturing, and numbers of rewrite voltage pulses respectively corresponding to the plurality of value ranges; and
a required-time output unit configured to determine a number of rewrite voltage pulses associated, in the table, with a value range including a value of a number of operations indicating an ordinal number, since manufacturing, of a rewrite operation for which a required time is to be computed, to compute the required time for the rewrite operation based on the number of rewrite voltage pulses determined, and to output data representing the required time,
wherein the required-time output unit includes a storage unit configured to store a maximum value, a minimum value, and an average value of the numbers of the rewrite voltage pulses stored in the table storage unit, and computes the required time for the rewrite operation based on one of the maximum value, the minimum value, or the average value stored in the storage unit.

17. A memory unit having a memory array, where the memory unit performs a rewrite operation by repeating application of a rewrite voltage pulse and verification, comprising:
a required-time output unit configured to output data specific to a chip as data representing a required time for the rewrite operation,
wherein the required-time output unit includes a storage unit configured to store a maximum value, a minimum value, and an average value of the numbers of times of the application of the rewrite voltage pulse for a plurality of the rewrite operations, and computes the required time for the rewrite operation based on one of the maximum value, the minimum value, or the average value stored in the storage unit.

18. The memory unit of claim 17, wherein
the data specific to the chip output by the required-time output unit is specific to a program data pattern which is a target of the rewrite operation.

19. The memory unit of claim 17, wherein
the data specific to the chip output by the required-time output unit is specific to an address of a target memory cell of the rewrite operation.

20. The memory unit of claim 17, wherein
the data specific to the chip output by the required-time output unit depends on a number of operations indicating an ordinal number, since manufacturing, of the rewrite operation for which the data representing the required time is output.

21. The memory unit of claim 17, wherein
the data specific to the chip output by the required-time output unit is specific to an ambient temperature.

22. The memory unit of claim 17, wherein
the data representing the required time for the rewrite operation is data representing a required time for a program operation.

23. The memory unit of claim 17, wherein
the data representing the required time for the rewrite operation is data representing a required time for an erase operation.

24. The memory unit of claim 17, wherein
the data representing the required time for the rewrite operation is data representing a total time of a required time for a program operation and a required time for an erase operation.

25. The memory unit of claim 17, wherein
the data representing the required time output by the required-time output unit is a number of system clocks corresponding to the required time.

26. The memory unit of claim 17, wherein
the data representing the required time output by the required-time output unit is a number of times of application of a rewrite voltage pulse corresponding to the required time.

27. The memory unit of claim 17, wherein
the data representing the required time output by the required-time output unit is expressed in units of seconds.

28. The memory unit of claim 17, wherein
the required-time output unit outputs the data representing the required time for the rewrite operation in response to issuance of a rewriting-time-period output command by a CPU.

29. The memory unit of claim 17, wherein
the required-time output unit outputs the data representing the required time for the rewrite operation as a part of rewrite status information in response to issuance of a rewrite command by a CPU.

30. The memory unit of claim 17, wherein
the required-time output unit includes a storage resistor configured to store a value of the required time for the rewrite operation, and outputs the value stored in the storage resistor as the data representing the required time for the rewrite operation in response to issuance of a read register command by a CPU.

\* \* \* \* \*